(12) United States Patent
Yoshimizu et al.

(10) Patent No.: US 9,646,989 B1
(45) Date of Patent: May 9, 2017

(54) THREE-DIMENSIONAL MEMORY DEVICE

(71) Applicant: KABUSHIKI KAISHA TOSHIBA, Tokyo (JP)

(72) Inventors: Yasuhito Yoshimizu, Mie (JP); Akifumi Gawase, Mie (JP); Yuya Akeboshi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/052,140

(22) Filed: Feb. 24, 2016

Related U.S. Application Data

(60) Provisional application No. 62/256,956, filed on Nov. 18, 2015.

(51) Int. Cl.
| | | |
|---|---|---|
| H01L 27/00 | (2006.01) |
| H01L 27/11582 | (2017.01) |
| H01L 29/06 | (2006.01) |
| H01L 27/11568 | (2017.01) |
| H01L 29/423 | (2006.01) |
| H01L 21/768 | (2006.01) |
| H01L 27/11578 | (2017.01) |
| H01L 27/06 | (2006.01) |
| H01L 21/822 | (2006.01) |
| H01L 27/11551 | (2017.01) |

(52) U.S. Cl.
CPC .. *H01L 27/11582* (2013.01); *H01L 21/76877* (2013.01); *H01L 21/8221* (2013.01); *H01L 27/0688* (2013.01); *H01L 27/11551* (2013.01); *H01L 27/11568* (2013.01); *H01L 27/11578* (2013.01); *H01L 29/0649* (2013.01); *H01L 29/42344* (2013.01); *H01L 2224/32145* (2013.01)

(58) Field of Classification Search
CPC ..... H01L 2224/32145; H01L 27/11578; H01L 27/0688; H01L 27/11551; H01L 21/8221
See application file for complete search history.

(56) References Cited

U.S. PATENT DOCUMENTS

| | | | |
|---|---|---|---|
| 8,426,908 B2 | 4/2013 | Higashi | |
| 8,692,312 B2* | 4/2014 | Fukuzumi | H01L 29/66833 257/324 |
| 8,957,501 B2 | 2/2015 | Hioka et al. | |
| 2010/0109071 A1* | 5/2010 | Tanaka | H01L 27/11582 257/324 |
| 2011/0001178 A1* | 1/2011 | Iwase | H01L 21/28282 257/315 |
| 2011/0031630 A1* | 2/2011 | Hashimoto | H01L 27/11578 257/774 |

(Continued)

OTHER PUBLICATIONS

U.S. Appl. No. 14/985,969, filed Dec. 31, 2015.
U.S. Appl. No. 15/003,919, filed Jan. 22, 2016.
U.S. Appl. No. 15/046,643, filed Feb. 18, 2016.

*Primary Examiner* — Ngan Ngo
(74) *Attorney, Agent, or Firm* — Finnegan, Henderson, Farabow, Garrett & Dunner, LLP

(57) ABSTRACT

According to one embodiment, the plurality of contact vias extend in the stacking direction in the insulating layer, and are in contact with the end parts of the electrode layers. The plurality of second columnar parts extend in the stacking direction in the second stacked part, and include a plurality of second semiconductor bodies being different in length in the stacking direction.

15 Claims, 25 Drawing Sheets

(56) References Cited

U.S. PATENT DOCUMENTS

| | | | |
|---|---|---|---|
| 2011/0147818 A1* | 6/2011 | Katsumata | H01L 27/11573 257/314 |
| 2011/0169071 A1* | 7/2011 | Uenaka | H01L 27/105 257/326 |
| 2012/0273862 A1* | 11/2012 | Tanzawa | H01L 27/11524 257/314 |
| 2013/0032874 A1 | 2/2013 | Ko | |
| 2015/0115455 A1* | 4/2015 | Chen | H01L 21/76895 257/773 |
| 2015/0179660 A1* | 6/2015 | Yada | H01L 21/02164 257/321 |
| 2016/0268304 A1* | 9/2016 | Ikeda | H01L 27/11582 |
| 2016/0322381 A1* | 11/2016 | Liu | H01L 27/11573 |

\* cited by examiner

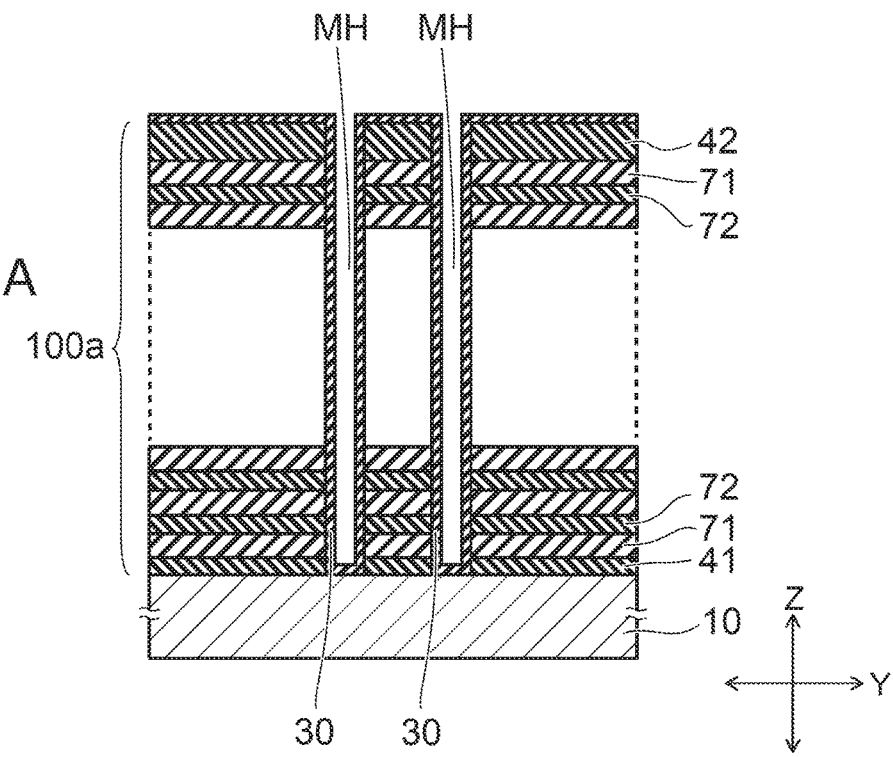
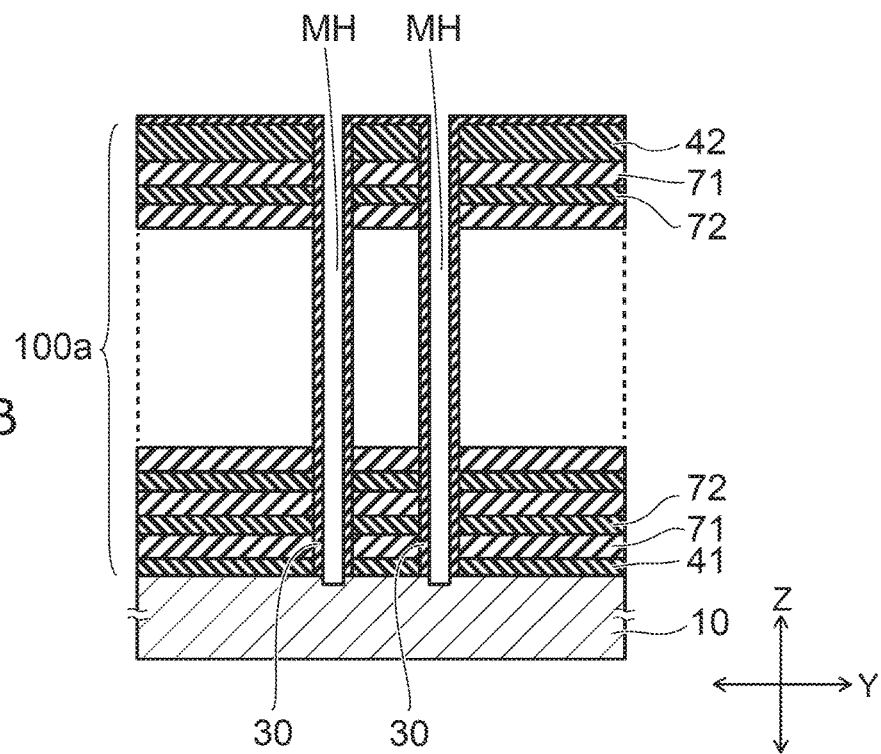

THREE-DIMENSIONAL MEMORY DEVICE

CROSS-REFERENCE TO RELATED APPLICATION

This application is based upon and claims the benefit of priority from U.S. Provisional Patent Application 62/256,956, filed on Nov. 18, 2015; the entire contents of which are incorporated herein by reference.

FIELD

Embodiments described herein relate generally to a semiconductor device and a method for manufacturing the same.

BACKGROUND

There is proposed a three-dimensional memory device having a structure in which a plurality of columnar parts including a charge storage film and a semiconductor body penetrate a plurality of electrode layers stacked with an insulator.

There is also proposed a structure in which an air gap is formed as the insulator between the electrode layers. The plurality of electrode layers stacked with the air gap are supported by the columnar parts.

There is also proposed a method for stacking a plurality of sacrificial layers with interlayer films to form a stacked body, forming the columnar parts in the stacked body, and then removing the sacrificial layers to replace them by electrode layers. After removing the sacrificial layers and before replacing them by electrode layers, the plurality of interlayer films stacked with the air gap are supported by the columnar parts.

There is also proposed a contact structure for connecting the electrode layers of the three-dimensional memory device to a control circuit. In this structure, the plurality of electrode layers are processed in a staircase shape. An air gap may be formed also in the portion of the stacked body in which the staircase structure is formed. This also requires support by the columnar parts. The contact via reaching the staircase-shaped electrode layers from above may interfere with the semiconductor body of the columnar part.

BRIEF DESCRIPTION OF THE DRAWINGS

FIGS. 6A to 13B are schematic cross-sectional views showing a method for manufacturing the semiconductor device of the embodiment;

FIGS. 14B to 23B are schematic cross-sectional views showing a method for manufacturing the semiconductor device of the embodiment;

DETAILED DESCRIPTION

According to one embodiment, a semiconductor device includes a substrate, a stacked body provided above the substrate, a first columnar part, an insulating layer, a plurality of contact vias, and a plurality of second columnar parts. The stacked body includes a plurality of electrode layers stacked with an insulator. The electrode layers have a plurality of end parts formed in a staircase shape. The stacked body includes a first stacked part and a second stacked part including the end parts. The first columnar part includes a first semiconductor body extending in a stacking direction in the first stacked part, and a stacked film provided between the first semiconductor body and one of the electrode layers. The stacked film includes a charge storage part. The insulating layer is provided above the second stacked part. The plurality of contact vias extend in the stacking direction in the insulating layer, and are in contact with the end parts of the electrode layers. The plurality of second columnar parts extend in the stacking direction in the second stacked part, and include a plurality of second semiconductor bodies being different in length in the stacking direction.

In the embodiment, the semiconductor device is described with reference to e.g. a semiconductor memory device including a memory cell array having a three-dimensional structure.

Figure 1:
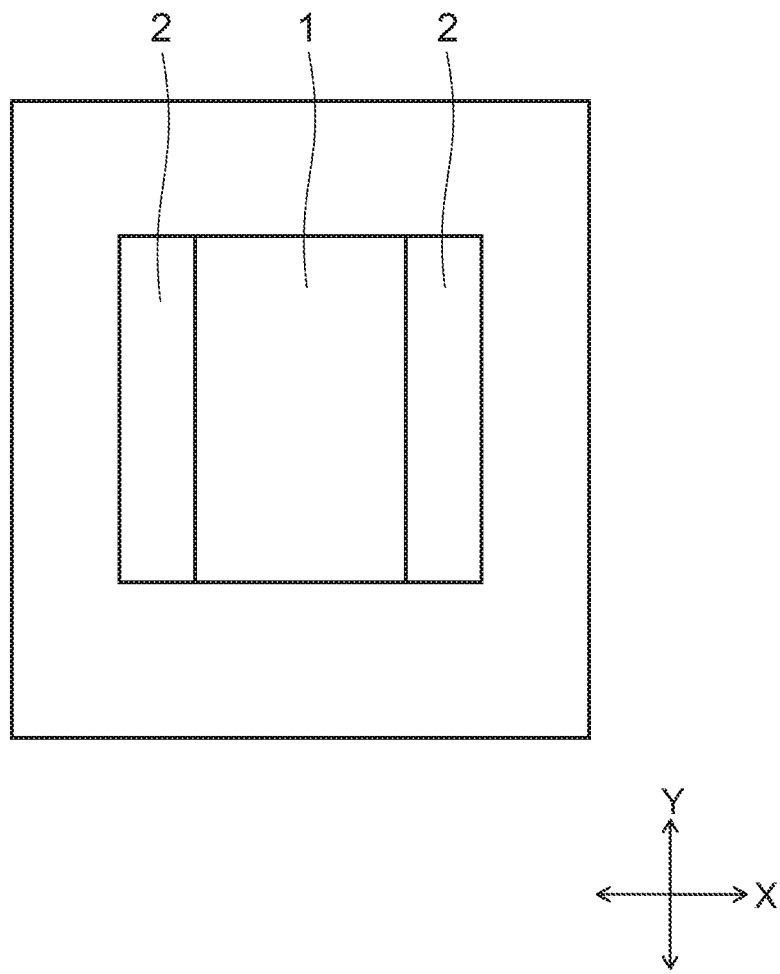
FIG. 1 is a schematic plan view showing an example of a planar layout of a semiconductor device of an embodiment.

FIG. 1 is a schematic plan view showing an example of the planar layout of the semiconductor device of the embodiment.

The semiconductor device of the embodiment includes a memory cell array 1 and a staircase section 2 provided outside the memory cell array 1. The memory cell array 1 and the staircase section 2 are provided on the same substrate.

Figure 2:
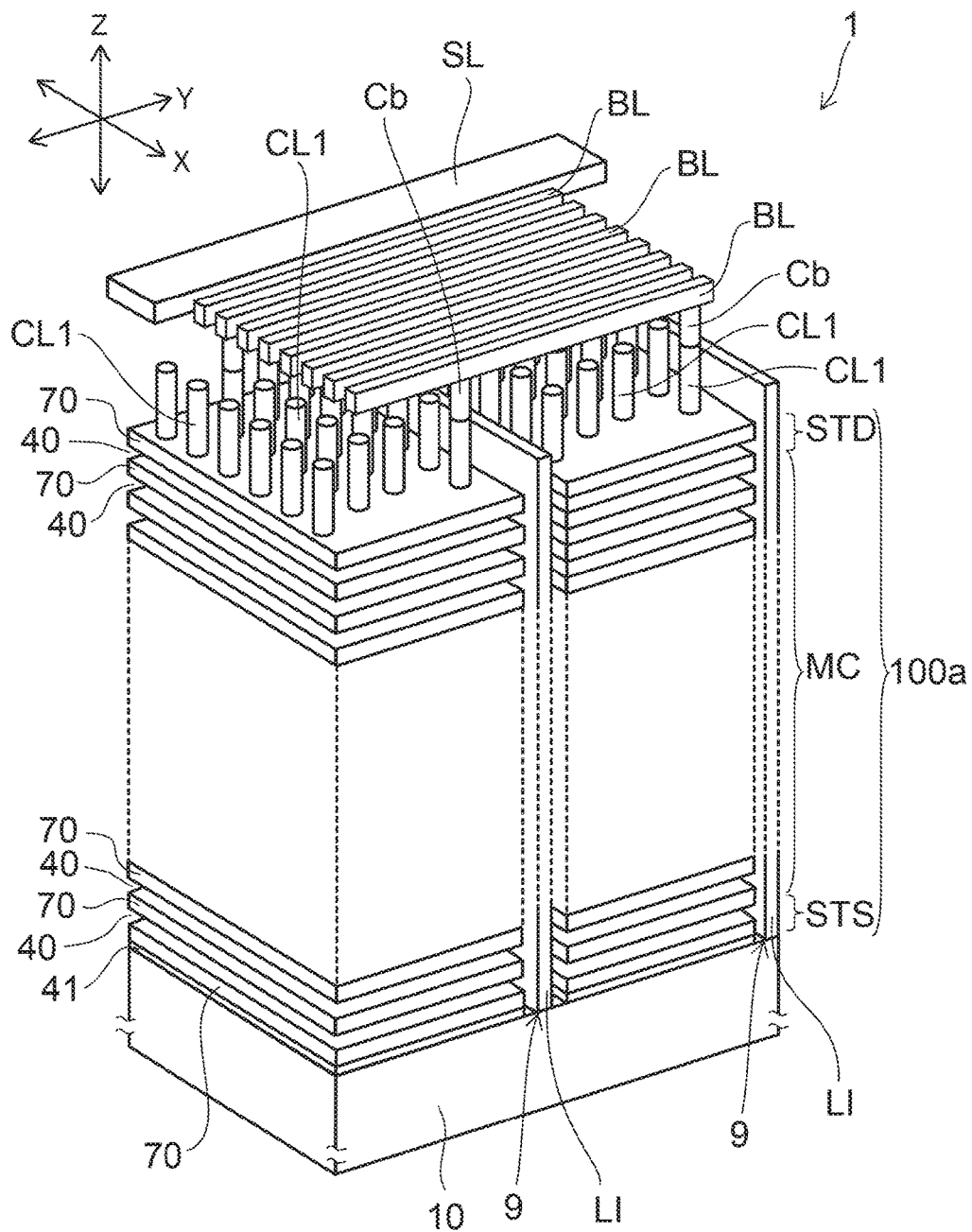
FIG. 2 is a schematic perspective view of a memory cell array of the semiconductor device of the embodiment.

FIG. 2 is a schematic perspective view of the memory cell array 1.

In FIG. 2, two directions parallel to the major surface of the substrate 10 and orthogonal to each other are referred to as X-direction and Y-direction. The direction orthogonal to both the X-direction and the Y-direction is referred to as Z-direction (stacking direction).

The X-direction and the Y-direction shown in FIG. 1 correspond to the X-direction and the Y-direction shown in FIG. 2. The staircase section 2 is provided outside the memory cell array 1 in the X-direction.

The X-direction, the Y-direction, and the Z-direction shown in the other figures also correspond to the X-direction, the Y-direction, and the Z-direction shown in FIG. 2.

As shown in FIG. 2, the memory cell array 1 includes a substrate 10, a first stacked part 100a provided on the major surface of the substrate 10, a plurality of first columnar parts CL1, a plurality of separation parts 9, and an upper interconnect provided on the first stacked part 100a. FIG. 2 shows e.g. a bit line BL and a source line SL as the upper interconnect.

The first columnar part CL1 is formed like a circular column or elliptical column extending in the stacking direction (Z-direction) in the first stacked part 100a. The separation part 9 spreads in the stacking direction (Z-direction) and the X-direction of the first stacked part 100a. The separation part 9 separates the first stacked part 100a into a plurality of blocks in the Y-direction.

The plurality of first columnar parts CL1 are arranged in e.g. a staggered arrangement. Alternatively, the plurality of first columnar parts CL1 may be arranged in a square lattice along the X-direction and the Y-direction.

A plurality of bit lines BL are provided on the first stacked part 100a. The bit lines BL are e.g. metal films extending in the Y-direction. The bit lines BL are separated from each other in the X-direction.

The upper end of the first columnar part CL1 is connected to the bit line BL via a contact part Cb. The plurality of first columnar parts CL1, each of which is selected from each of blocks separated in the Y-direction by the separation part 9, are connected to one common bit line BL.

Figure 3:
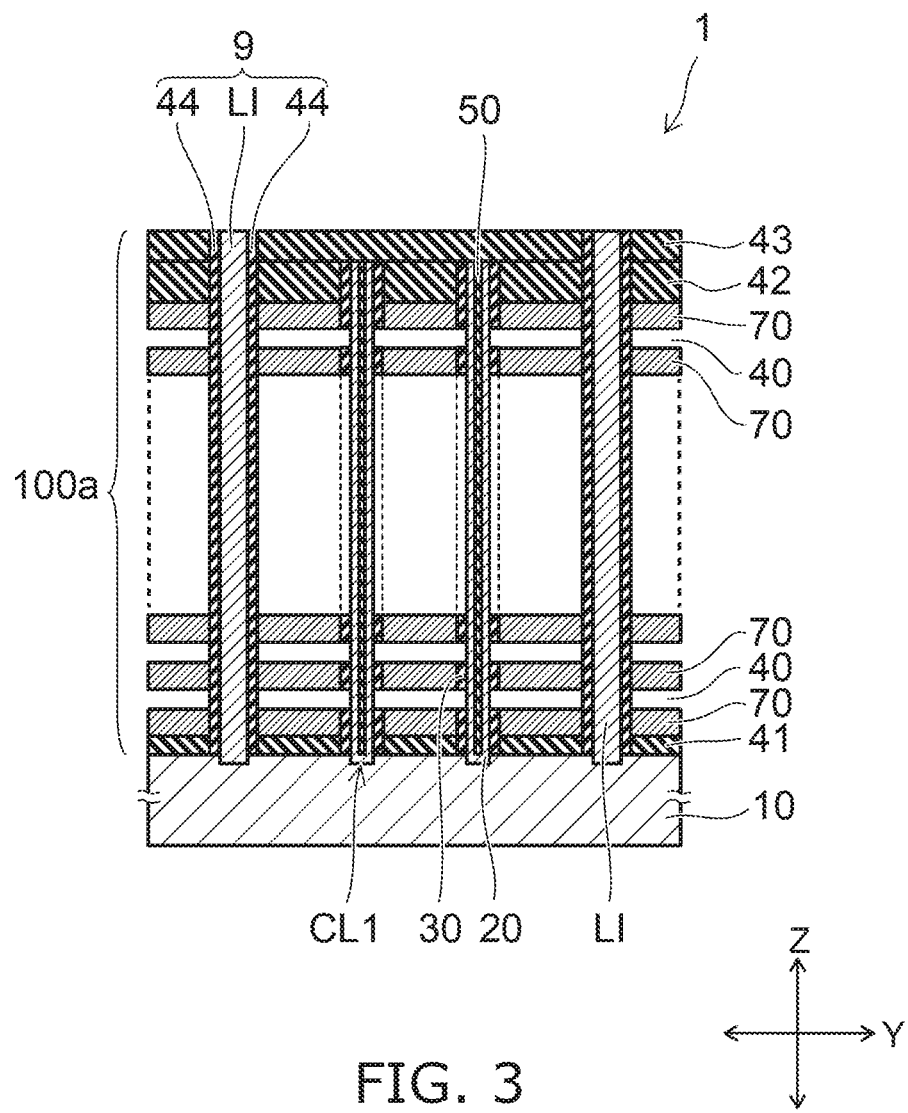
FIG. 3 is a schematic sectional view of the memory cell array of the semiconductor device of the embodiment.

FIG. 3 is a schematic sectional view of the memory cell array 1.

The first stacked part 100a includes a plurality of electrode layers 70 stacked on the major surface of the substrate 10. The plurality of electrode layers 70 are stacked with an air gap 40 interposed in the direction (Z-direction) perpendicular to the major surface of the substrate 10. Instead of the air gap 40, an insulating layer may be provided as an insulator between the electrode layers 70. The electrode layer 70 is a metal layer such as a tungsten layer or molybdenum layer.

The stacked body including the plurality of electrode layers 70 is provided also in the staircase section 2 described later with reference to FIG. 5B. In the stacked body, the portion provided in the memory cell array 1 is referred to as first stacked part 100a, and the portion provided in the staircase section 2 is referred to as second stacked part 100b.

An insulating film 41 is provided between the major surface of the substrate 10 and the lowermost electrode layer 70. An insulating film 42 is provided on the uppermost electrode layer 70. An insulating film 43 is provided on the insulating film 42.

Figure 4A:
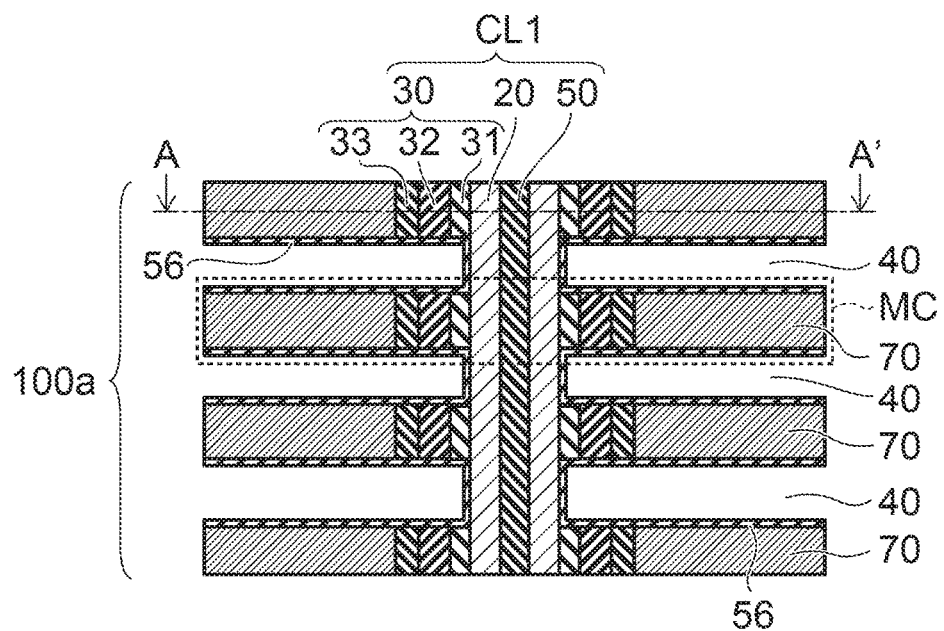
FIG. 4A is a partial enlarged view of the cross section shown in FIG. 3.
Figure 4B:
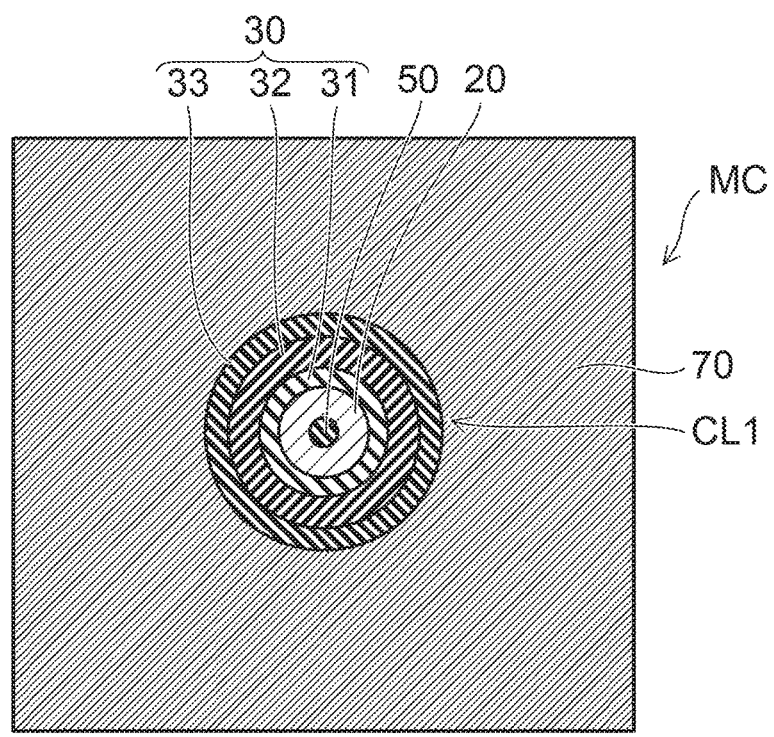
FIG. 4B is a sectional view taken along A-A' in FIG. 4A.

FIG. 4A is a partial enlarged view of the cross section shown in FIG. 3. FIG. 4B is a sectional view taken along A-A' in FIG. 4A.

The first columnar part CL1 includes a memory film 30, a first semiconductor body 20, and an insulating core film 50. The first semiconductor body 20 extends like a pipe in the stacking direction (Z-direction) in the first stacked part 100a. The memory film 30 is provided between the electrode layer 70 and the first semiconductor body 20. The memory film 30 surrounds the first semiconductor body 20 from the outer peripheral side. The core film 50 is provided inside the pipe-shaped first semiconductor body 20. The upper end of the first semiconductor body 20 is electrically connected to the bit line BL via the contact part Cb shown in FIG. 2.

The memory film 30 is a stacked film including a tunnel insulating film 31, a charge storage film (charge storage part) 32, and a block insulating film 33. The block insulating film 33, the charge storage film 32, and the tunnel insulating film 31 are provided between the electrode layer 70 and the first semiconductor body 20 sequentially from the electrode layer 70 side. The tunnel insulating film 31 is in contact with the first semiconductor body 20. The block insulating film 33 is in contact with the electrode layer 70. The charge storage film 32 is provided between the block insulating film 33 and the tunnel insulating film 31.

The first semiconductor body 20 extends continuously in the stacking direction of the first stacked part 100a. The air gap 40 between the vertically adjacent electrode layers 70 extends to the first semiconductor body 20 side so as to divide at least the block insulating film 33 and the charge storage film 32 of the memory film 30 in the stacking direction. That is, the block insulating film 33 and the charge storage film 32 are separated in the stacking direction via the air gap 40. The tunnel insulating film 31 may be continued or divided in the stacking direction.

The memory film 30 is provided between the inner peripheral surface of the electrode layer 70 surrounding the first columnar part CL1, and the outer peripheral surface of the first semiconductor body 20 continuously in the direction connecting the inner peripheral surface and the outer peripheral surface. The plurality of electrode layers 70 are physically connected to the first columnar part CL1 via the memory film 30 and supported by the first columnar part CL1.

The outer peripheral surface of the first semiconductor body 20, and the upper surface and the lower surface of the electrode layer 70 are not exposed to the air gap 40, but covered and protected with a protective film 56. The protective film 56 is an insulating film such as silicon oxide film.

The first semiconductor body 20, the memory film 30, and the electrode layer 70 constitute a memory cell MC. In FIG. 4A, one memory cell MC is schematically shown by the broken line. The memory cell MC has a vertical transistor structure in which the first semiconductor body 20 is surrounded with the electrode layer 70 via the memory film 30.

In the memory cell MC having the vertical transistor structure, the first semiconductor body 20 is e.g. a channel body of silicon. The electrode layer 70 functions as a control gate. The charge storage film 32 functions as a data storage layer for storing charge injected from the first semiconductor body 20.

The semiconductor memory device of the embodiment is a nonvolatile semiconductor memory device capable of electrically and freely erasing/writing data and retaining its memory content even when powered off.

The memory cell MC is e.g. a charge trap type memory cell. The charge storage film 32 includes a large number of trap sites for trapping charge in the insulating film, and includes e.g. silicon nitride film. Alternatively, the charge storage film 32 may be a conductive floating gate surrounded with an insulator.

The tunnel insulating film 31 serves as a potential barrier when charge is injected from the first semiconductor body 20 into the charge storage film 32, or when the charge stored in the charge storage film 32 is released into the first semiconductor body 20. The tunnel insulating film 31 includes e.g. silicon oxide film.

The block insulating film 33 prevents the charge stored in the charge storage film 32 from being released into the electrode layer 70. The block insulating film 33 suppresses back tunneling of electrons from the electrode layer 70 at the time of erase operation. The block insulating film 33 includes e.g. at least one of silicon oxide film and metal oxide film.

As shown in FIG. 2, a drain side select transistor STD is provided in the upper end part of the first columnar part CL1. A source side select transistor STS is provided in the lower end part of the first columnar part CL1. For instance, the lowermost electrode layer 70 functions as a control gate of the source side select transistor STS. For instance, the uppermost electrode layer 70 functions as a control gate of the drain side select transistor STD.

A plurality of memory cells MC are provided between the drain side select transistor STD and the source side select transistor STS. The memory cells MC, the drain side select transistor STD, and the source side select transistor STS are series connected through the first semiconductor body 20 and constitute one memory string. Such memory strings are arranged in e.g. a staggered arrangement in the plane direction parallel to the X-Y plane. Thus, the plurality of memory cells MC are provided three-dimensionally in the X-direction, the Y-direction, and the Z-direction.

As shown in FIGS. 2 and 3, the separation part 9 separating the first stacked part 100a in the Y-direction includes an interconnect part LI. The interconnect part LI is e.g. a metal-containing film spread in the Z-direction and the X-direction. As shown in FIG. 3, an insulating film 44 is provided on the sidewall of the interconnect part LI. The insulating film 44 is provided between the first stacked part 100a and the interconnect part LI.

The upper end of the interconnect part LI is connected to the source line SL, shown in FIG. 2, provided on the first stacked part 100a. The lower end of the interconnect part LI is in contact with the substrate 10 as shown in FIG. 3. The lower end of the first semiconductor body 20 is in contact with the substrate 10. The substrate 10 is e.g. a silicon substrate doped with impurity and having conductivity. Thus, the lower end of the first semiconductor body 20 is electrically connectable to the source line SL via the substrate 10 and the interconnect part LI.

By controlling the potential applied to the lowermost electrode layer 70 provided on the surface of the substrate 10 via the insulating film 41, a channel is induced in the surface of the substrate 10 between the lower end of the interconnect part LI and the lower end of the first semiconductor body 20. Thus, a current can be passed between the lower end of the interconnect part LI and the lower end of the first semiconductor body 20.

The lowermost electrode layer 70 functions as a control gate for inducing a channel in the surface of the substrate 10. The insulating film 41 functions as a gate insulating film. The portion between the surface of the substrate 10 and the lowermost electrode layer 70 is not an air gap, but the insulating film 41 having higher dielectric constant than air. This enables fast driving by capacitive coupling between the lowermost electrode layer 70 and the surface of the substrate 10.

On the other hand, an air gap 40 is formed between the electrode layers 70, which are control gates of the memory cells MC adjacent in the stacking direction. This can reduce the interconnect capacitance between the vertically adjacent electrode layers 70 and enables fast operation of the memory cell MC. Furthermore, this can suppress interference between adjacent cells such as threshold variation due to capacitive coupling between the vertically adjacent electrode layers 70.

According to the embodiment, the charge storage films 32 are separated in the stacking direction. Thus, the charge stored in the charge storage film 32 is not released in the stacking direction. Accordingly, the memory cell MC is superior in charge retention characteristics.

Next, the staircase section 2 is described.

Figure 5A:
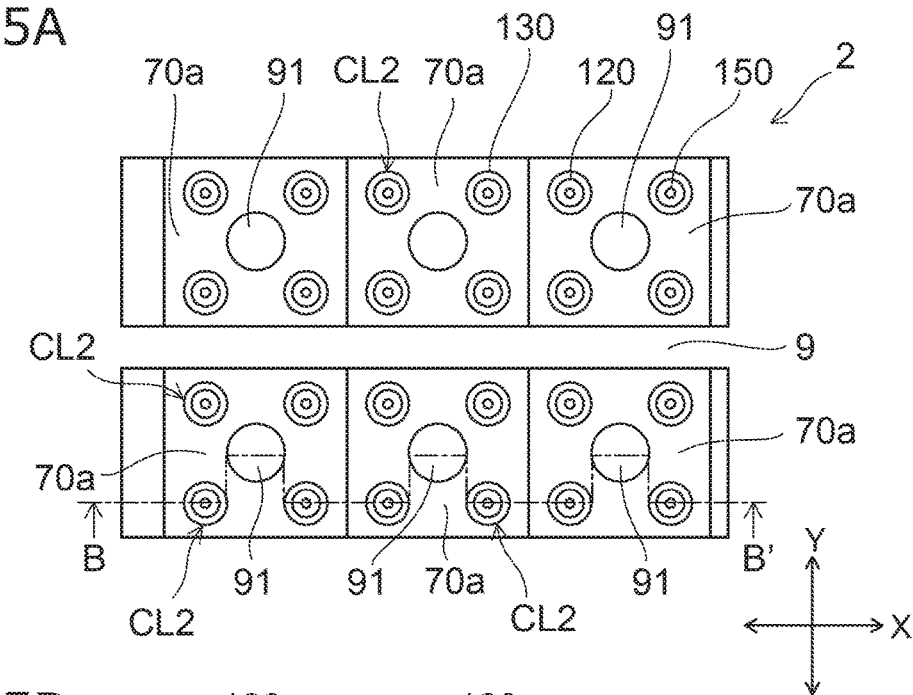
FIG. 5A is a schematic plan view showing an example of a planar layout of a staircase section of the semiconductor device of the embodiment.
Figure 5B:
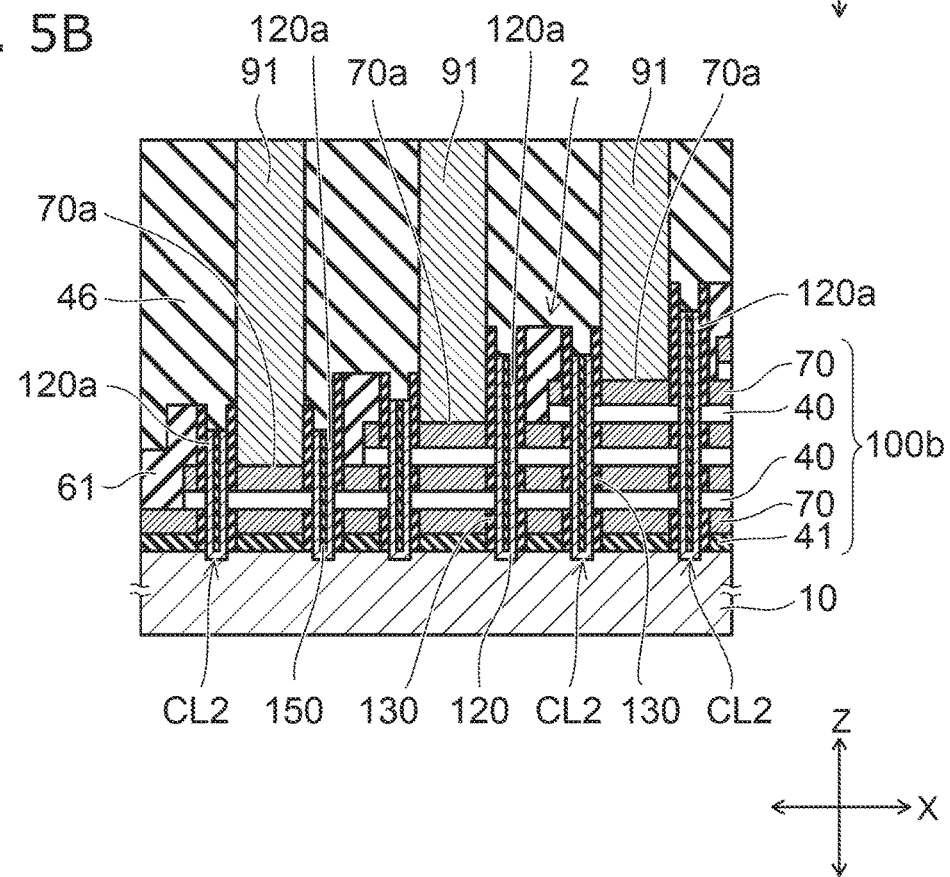
FIG. 5B is a schematic sectional view of the staircase section.

FIG. 5A is a schematic plan view showing an example of the planar layout of the staircase section 2. FIG. 5B is a schematic sectional view of the staircase section 2. FIG. 5B corresponds to a cross section taken along B-B' in FIG. 5A.

The plurality of electrode layers 70 extend in the X-direction from the region with the memory cell array 1 formed therein to the region with the staircase section 2 formed therein. A second stacked part 100b is provided on the substrate 10 in the region with the staircase section 2 formed therein. The second stacked part 100b includes the plurality of electrode layers 70 stacked in the Z-direction with the air gap 40. The insulating film 41 is provided between the lowermost electrode layer 70 and the substrate 10 in the second stacked part 100b.

The plurality of electrode layers 70 of the second stacked part 100b have a plurality of end parts (or terrace parts) 70a formed in a staircase shape. The end parts 70a of the electrode layers 70 are arranged in a staircase shape along the X-direction.

As in the memory cell array 1, the second stacked part 100b is also separated into a plurality of blocks in the Y-direction by the separation part 9 extending in the X-direction as shown in FIG. 5A.

A first cover layer 61 is provided on the second stacked part 100b so as to cover the plurality of staircase-shaped end parts 70a. An insulating layer 46 is provided on the first cover layer 61 so as to eliminate or reduce the step difference with the memory cell array 1. The first cover layer 61 and the insulating layer 46 are not shown in FIG. 5A.

A plurality of contact vias 91 extending in the Z-direction are provided in the insulating layer 46. Each lower end of the contact vias 91 is connected to the corresponding end part 70a of the electrode layers 70.

The contact via 91 is a metal-containing conductor. Each contact via 91 is connected to the upper interconnect, not shown, provided above the second stacked part 100b.

Each electrode layer 70 of the staircase section 2 is integrally connected to the corresponding electrode layer 70 of the memory cell array 1. Thus, the electrode layer 70 of the memory cell array 1 is electrically connected to the upper interconnect via the contact via 91 of the staircase section 2. The upper interconnect is electrically connected to e.g. a control circuit formed on the surface of the substrate 10.

Also in the second stacked part 100b, the air gap 40 is formed between the plurality of electrode layers 70. The second stacked part 100b also includes a plurality of second columnar parts CL2 supporting the plurality of electrode layers 70 stacked with the air gap 40.

At least one contact via 91 is provided per one end part 70a of one electrode layer 70 in one block separated from the other blocks by the separation part 9. In the example shown in FIG. 5A, one contact via 91 and a plurality of second columnar parts CL2 placed around that contact via 91 are provided per one end part 70a of one electrode layer 70 in one block. In the example shown in FIG. 5A, four second columnar parts CL2 are equally spaced around the one contact via 91.

The second columnar parts CL2 are formed at the same time as the first columnar parts CL1 of the memory cell array 1 are formed. The second columnar part CL2 is formed like a circular column or elliptical column extending in the stacking direction (Z-direction) in the second stacked part 100b.

The second columnar part CL2 includes an insulating film 130, a second semiconductor body 120, and a core film 150. The insulating film 130 is formed at the same time as the memory film 30 of the first columnar part CL1 is formed. The insulating film 130 includes a film of the same stacked structure or the same material as the memory film 30. The second semiconductor body 120 is formed at the same time from the same material as the first semiconductor body 20 of the first columnar part CL1 is formed. The core film 150 is formed at the same time from the same material as the core film 50 of the first columnar part CL1 is formed.

The second semiconductor body 120 extends like a pipe in the stacking direction (Z-direction) in the second stacked part 100b. The insulating film 130 is provided between the electrode layer 70 and the second semiconductor body 120. The insulating film 130 surrounds the second semiconductor body 120 from the outer peripheral side. The core film 150 is provided inside the pipe-shaped second semiconductor body 120.

The lower end of the second semiconductor body 120 is in contact with the substrate 10. However, the upper end of the second semiconductor body 120 is electrically connected to nowhere. The second semiconductor body 120 functions as a mere strut supporting the plurality of electrode layers 70.

The insulating film 130 is provided between the inner peripheral surface of the electrode layer 70 surrounding the second columnar part CL2 and the outer peripheral surface of the second semiconductor body 120 continuously in the direction connecting the inner peripheral surface and the outer peripheral surface. The plurality of electrode layers 70 are physically connected to the second columnar part CL2 via the insulating film 130 and supported by the second columnar part CL2.

The position of the upper end of the second columnar part CL2 is lower than the position of the upper end of the first columnar part CL1. The length (Z-direction length) of the second columnar part CL2 is shorter than the length of the first columnar part CL1. The position of the upper end of the second semiconductor body 120 is lower than the position of the upper end of the first semiconductor body 20. The length (Z-direction length) of the second semiconductor body 120 is shorter than the length of the first semiconductor body 20.

The plurality of second columnar parts CL2 are not equal in length. The plurality of second columnar parts CL2 provided in the second stacked part 100b include a plurality of second columnar parts CL2 different in length. In particular, the plurality of second semiconductor bodies 120 are not equal in length. The plurality of second semiconductor bodies 120 provided in the second stacked part 100b include a plurality of second semiconductor bodies 120 different in length.

The plurality of second semiconductor bodies 120 include a second semiconductor body 120 having a protrusion 120a protruding above the second stacked part 100b. That second semiconductor body 120 penetrates through the end part 70a of the electrode layer 70 and through the electrode layers 70 between that end part 70a and the substrate 10. The protrusion 120a protrudes above the end part 70a.

The length of the protrusion 120a is shorter than the length of the portion of the second semiconductor body 120 extending below that protrusion 120a in the second stacked part 100b.

The second stacked part 100b includes the end parts 70a of the electrode layers 70 formed in a staircase shape. The second stacked part 100b includes a lower stage part and an upper stage part. In the lower stage part, the number of stacked electrode layers 70 is relatively small. In the upper stage part, the number of stacked electrode layers 70 is larger than that in the lower stage part. The relationship between the lower stage part and the upper stage part is also applicable to the relationship between the stage parts adjacent in the X-direction, and the relationship between the stage parts spaced in the X-direction.

The length of the lower-stage second columnar part CL2 provided in the lower stage part is shorter than the length of the upper-stage second columnar part CL2 provided in the upper stage part. The length of the lower-stage second semiconductor body 120 provided in the lower stage part is shorter than the length of the upper-stage second semiconductor body 120 provided in the upper stage part.

The plurality of contact vias 91 include lower-stage contact vias 91 in contact with the end parts 70a of relatively lower electrode layers 70, and upper-stage contact vias 91 in contact with the end parts 70a of relatively upper electrode layers 70. The upper ends of the plurality of contact vias 91 are located at a generally equal height. The lower ends of the contact vias 91 on the relatively lower stage side are located on the relatively lower side. Thus, the length of the upper-stage contact via 91 is shorter than the length of the lower-stage contact via 91. The length of the lower-stage contact via 91 is longer than the length of the upper-stage contact via 91.

The length of the lower-stage second columnar part CL2 placed adjacent to or around the lower-stage contact via 91 is shorter than the length of the upper-stage second columnar part CL2 placed adjacent to or around the upper-stage contact via 91. The length of the lower-stage second semiconductor body 120 placed adjacent to or around the lower-stage contact via 91 is shorter than the length of the upper-stage second semiconductor body 120 placed adjacent to or around the upper-stage contact via 91.

As shown in FIG. 5A, the side surface of the contact via 91 is spaced from the side surface of the second columnar part CL2 placed adjacent to or around that contact via 91. The contact via 91 is not in contact with the second semiconductor body 120.

Thus, the contact via 91 and the substrate 10 are not electrically connected (short-circuited) through the second semiconductor body 120.

In the example shown in FIG. 5A, the contact via 91 is also not in contact with the insulating film 130 of the second columnar part CL2. The insulating film 130 includes a film of the same material as the memory film 30 of the first columnar part CL1. The insulating film 130 includes a film of the same material as the block insulating film 33 at the outermost periphery, and includes a film of the same material as the charge storage film 32 inside. The contact via 91 may be in contact with the film in the insulating film 130 of the same material as the block insulating film 33.

The charge storage film 32 has a lower mobility than the semiconductor film. However, migration of electrons may occur in the charge storage film 32. Thus, it is not desirable that the contact via 91 be in contact with the film in the insulating film 130 of the same material as the charge storage film 32.

The contact via 91 extends upward from the end part 70a of the electrode layer 70 of the connection target. Thus, in the second semiconductor body 120, the protrusion 120a protruding above the end part 70a of the electrode layer 70 may contact with the contact via 91.

The contact via 91 is formed in a hole formed by reactive ion etching (RIE) technique in the insulating layer 46 and the first cover layer 61. In the RIE, the hole side surface may be tapered so that the hole diameter decreases with the depth. In this case, as shown in FIG. 24B described later, in the contact via 91, a portion 91a thicker (larger in diameter) than the lower end part 91b is formed above the lower end part 91b in contact with the end part 70a of the electrode layer 70. If the second semiconductor body 120 extends to the upper end of the contact via 91, the contact via 91 may be in contact with the second semiconductor body 120 in the upper part 91a even though the contact via 91 is not in contact with the second semiconductor body 120 in the lower end part 91b.

According to the embodiment, the second semiconductor body 120 is formed at the same time as the first semiconductor body 20 of the memory cell array 1 is formed. Then, in the second semiconductor body 120, the protrusion 120a protruding above the end part 70a of the electrode layer 70 is etched as described later to shorten the length of the protrusion 120a.

Thus, the second semiconductor body 120 can be excluded from the region adjacent to or around the upper part of the contact via 91, which tends to be thicker than the lower end part. The possibility of contact is reduced between the contact via 91 and the second semiconductor body 120. This can prevent current leakage between the contact via 91 and the substrate 10 through the second semiconductor body 120.

In the structure of the embodiment, the contact via 91 is less likely to be in contact with the second semiconductor body 120. This structure enables reduction of the distance between the contact via 91 and the second semiconductor body 120. Thus, the terrace region (area of the end part 70a) shown in FIG. 5A can be reduced. The terrace region includes, for example, one contact via 91 and four second semiconductor bodies 120 therearound. This leads to the reduction of the chip size.

Figure 24A:
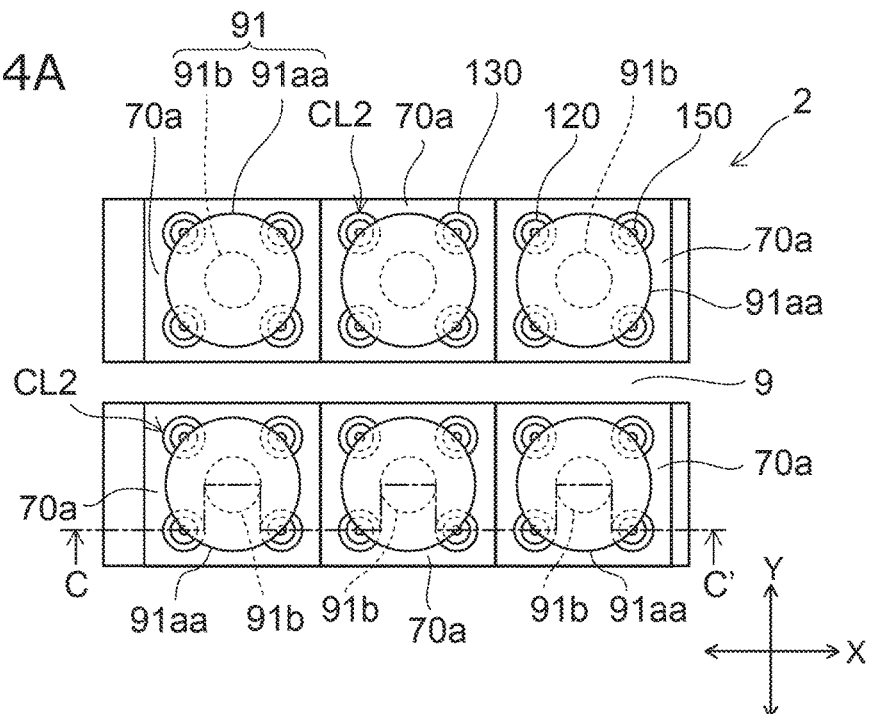
FIG. 24A is a schematic plan view showing another example of a planar layout of a staircase section of the semiconductor device of the embodiment.
Figure 24B:
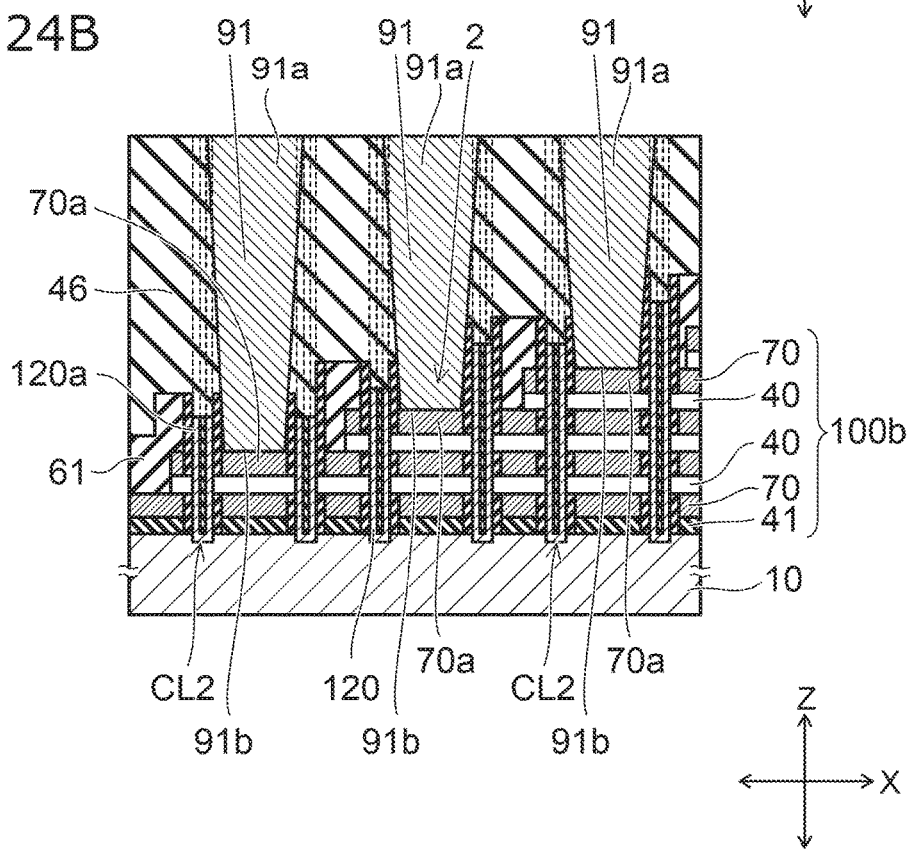
FIG. 24B is a schematic sectional view of the another example of the staircase section.

FIG. 24A is a schematic plan view showing the planar layout of an alternative example of the staircase section 2. FIG. 24B is a schematic sectional view of the alternative example of the staircase section 2. FIG. 24B corresponds to a cross section taken along C-C' in FIG. 24A.

The contact via 91 includes an upper part 91a located above the upper end of the second semiconductor body 120. The thickness (diameter) of the upper part 91a is larger than the thickness (diameter) of the lower end part 91b in contact with the end part 70a of the electrode layer 70. The side surface of the contact via 91 is tapered so that the contact via 91 is thinned toward the lower end part 91b.

In FIG. 24B, the extension line extending upward from the upper end of the second semiconductor body 120 is virtually shown by the broken line. The side surface of the upper part 91a of the contact via 91 overlaps the region in which the second semiconductor body 120 placed adjacent to or around that contact via 91 is extended upward. As shown in the planar layout of FIG. 24A, the outline 91aa of the upper end of the contact via 91 spreads to part of the placement region of the second semiconductor body 120 therearound.

According to the embodiment, the length of the protrusion 120a of the second semiconductor body 120 is shortened. Thus, even if the upper part 91a of the contact via 91 is made thicker, the upper part 91a is not in contact with the second semiconductor body 120. The resistance of the contact via 91 can be reduced by forming a thick portion (upper part 91a) in the contact via 91.

Figure 23A:
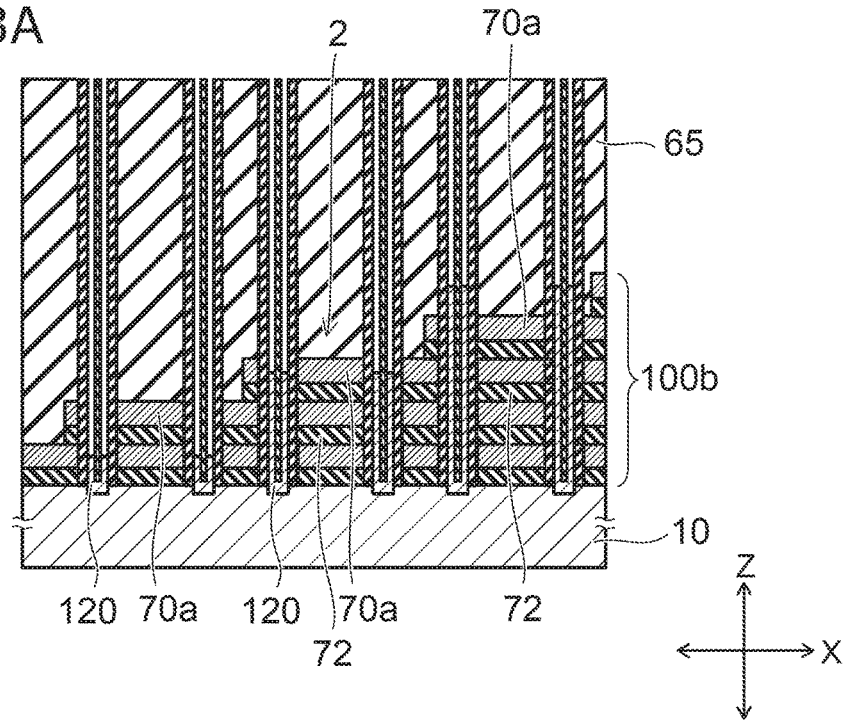
Figure 23B:
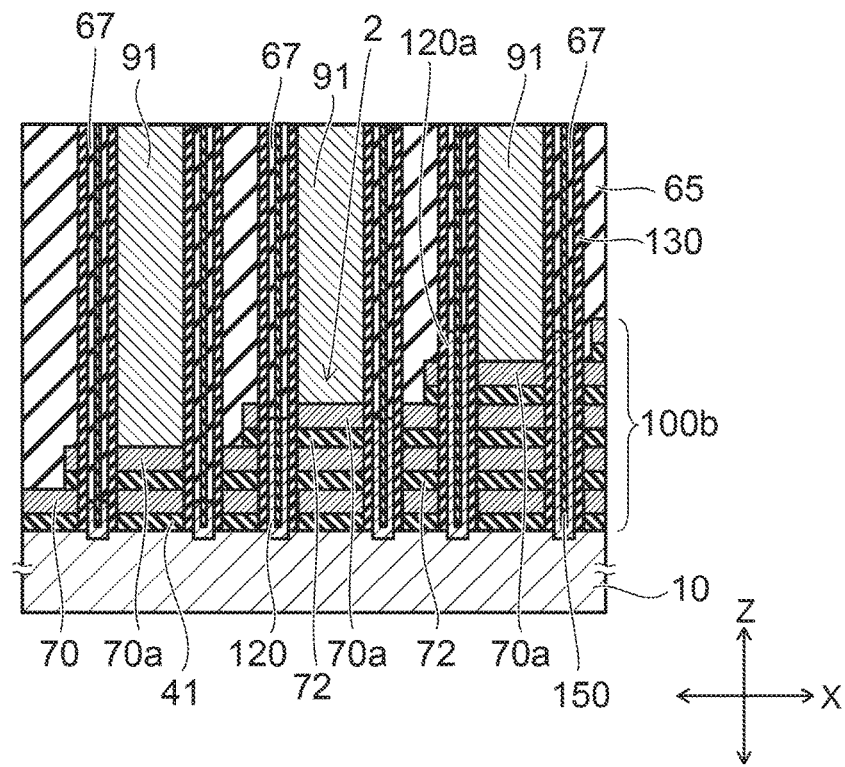

FIG. 23B is a schematic sectional view showing a further alternative example of the staircase section 2.

Figure 25A:
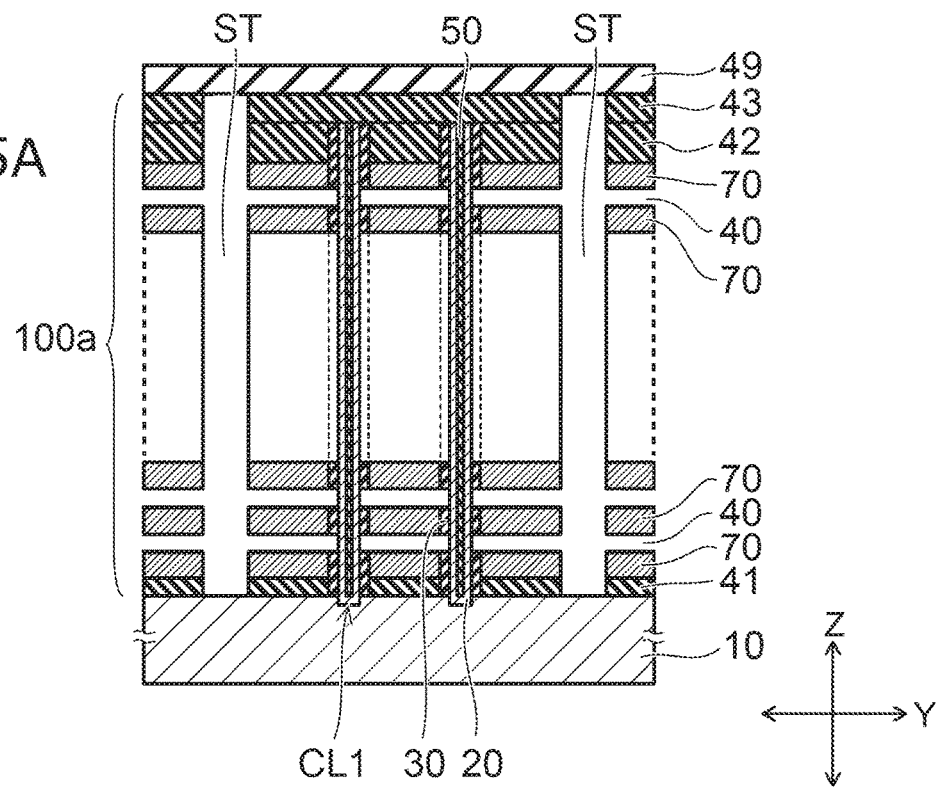
FIGS. 25A and 25B are schematic sectional views of another example of a memory cell array of the semiconductor device of the embodiment.
Figure 25B:
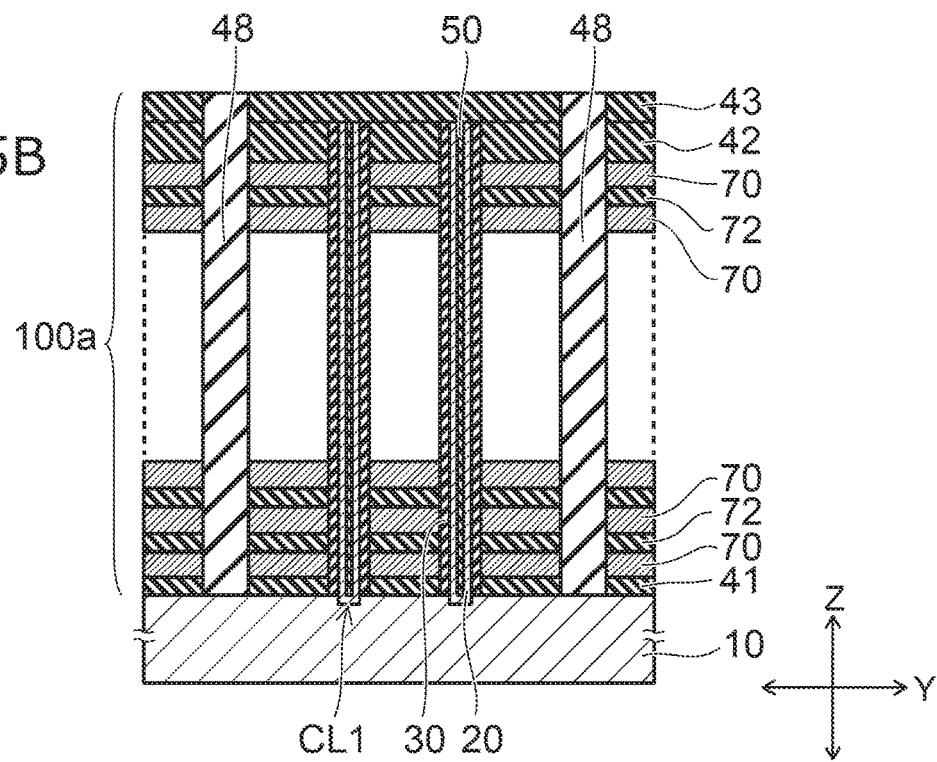

FIG. 25B is a schematic sectional view of a memory cell array in a semiconductor device including the staircase section 2 shown in FIG. 23B.

As shown in FIG. 25B, an insulating layer 72 rather than an air gap is provided between the plurality of electrode layers 70. An insulating film 48 is provided as a separation part separating the first stacked part 100a into a plurality in the Y-direction. The memory film 30 is not divided in the vertical direction (Z-direction).

In the example shown in FIG. 23B, the plurality of second semiconductor bodies 120 include a second semiconductor body 120 with the upper end located in the second stacked part 100b without protruding from the second stacked part 100b. An insulating layer 65 doubling as a cover layer is provided on the second stacked part 100b so as to eliminate or reduce the step difference with the memory cell array 1.

Also in the second stacked part 100b, as in the first stacked part 100a shown in FIG. 25B, an insulating layer 72 rather than an air gap is provided between the plurality of electrode layers 70. Thus, the plurality of electrode layers 70 can maintain the stacked state with a prescribed spacing even without the support of the second columnar parts CL2.

Figure 18A:
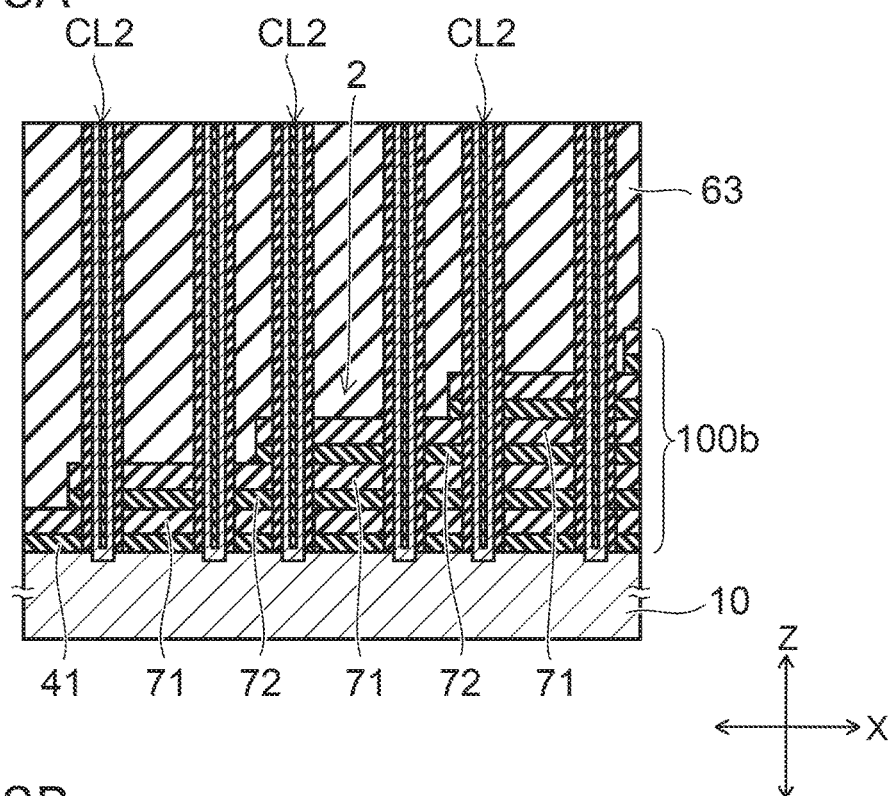
Figure 18B:
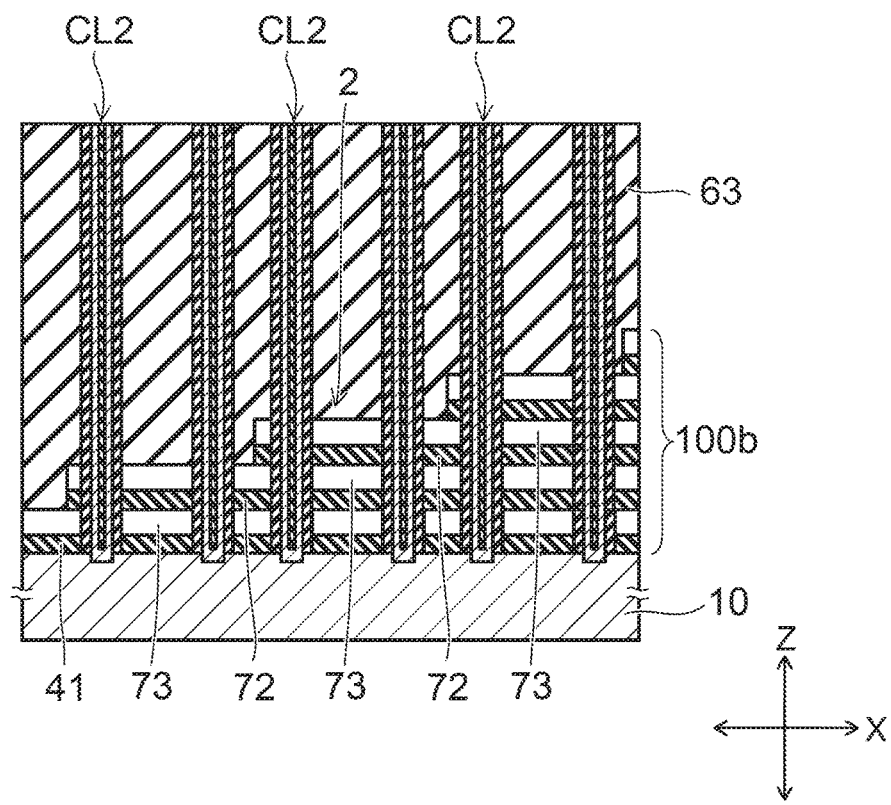

As shown in FIG. 18A described later, a sacrificial layer 71 is formed in the portion in which the electrode layer 70 is to be formed. Then, the sacrificial layer 71 is removed, and an air gap 73 is formed between the insulating layers 72 as shown in FIG. 18B. At this time, the second columnar part CL2 supports the insulating layer 72.

After the electrode layer 70 is formed in the air gap 73, if the insulating layer 72 is not removed, the electrode layer 70 is supported by the insulating layer 72. Thus, as in part of the second semiconductor bodies 120 shown in FIG. 23A, the upper end may be retracted downward from the end part 70a of the electrode layer 70. Alternatively, the second semiconductor body 120 may be eliminated.

Thus, the protrusion 120a of the second semiconductor body 120 likely to be in contact with the contact via 91 is eliminated. This can enlarge the contact area between the contact via 91 and the end part 70a of the electrode layer 70. Furthermore, the diameter of the contact via 91 can be increased. There are no restrictions to the placement of the second semiconductor body 120. This can further reduce the resistance of the contact via 91.

Next, a method for manufacturing a semiconductor device of the embodiment is described.

First, a method for forming the memory cell array 1 is described with reference to FIGS. 6A to 11B.

Figure 6A:
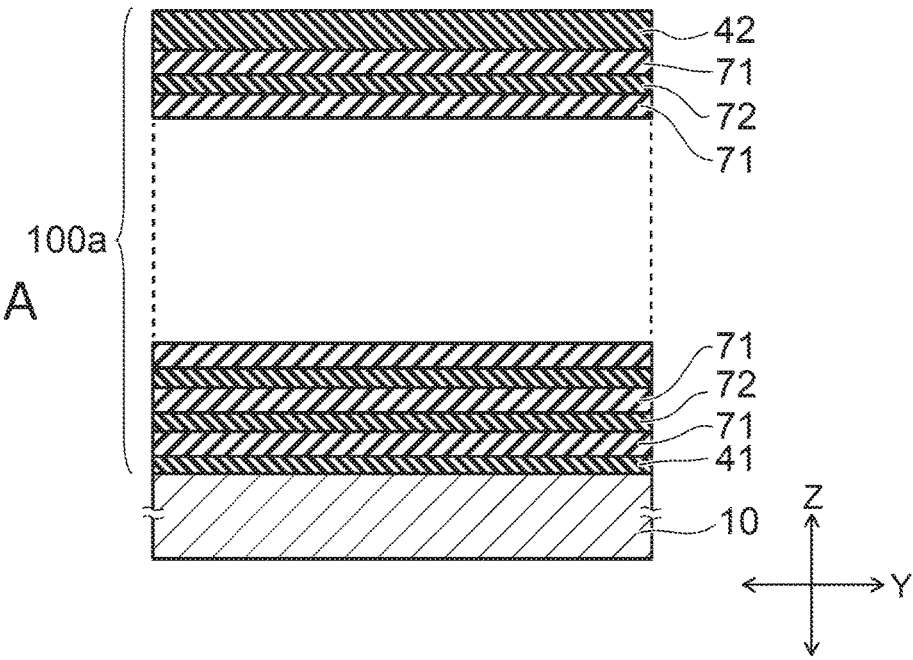

As shown in FIG. 6A, a first stacked part 100a is formed on a substrate 10. The substrate 10 is e.g. a semiconductor substrate such as a silicon substrate.

An insulating film 41 is formed on the major surface (front surface) of the substrate 10. A first layer 71 and a second layer 72 are alternately stacked on the insulating film 41. The step of alternately stacking a first layer 71 and a second layer 72 is repeated to form a plurality of first layers 71 and a plurality of second layers 72 on the substrate 10. The first layer 71 is a sacrificial layer to be removed in a later step. The first layer 71 is e.g. a silicon nitride layer. The second layer 72 is a sacrificial layer to be removed in a later step. The second layer 72 is e.g. a silicon oxide layer. Alternatively, as shown in FIG. 25B, the second layer 72 may be an insulating layer (e.g., silicon oxide layer) left without being removed.

The lowermost first layer 71 is formed on the insulating film 41. The lowermost second layer 72 is formed on the lowermost first layer 71. An insulating film 42 is formed on the uppermost first layer 71. The uppermost first layer 71 is formed between the uppermost second layer 72 and the insulating film 42.

Figure 6B:
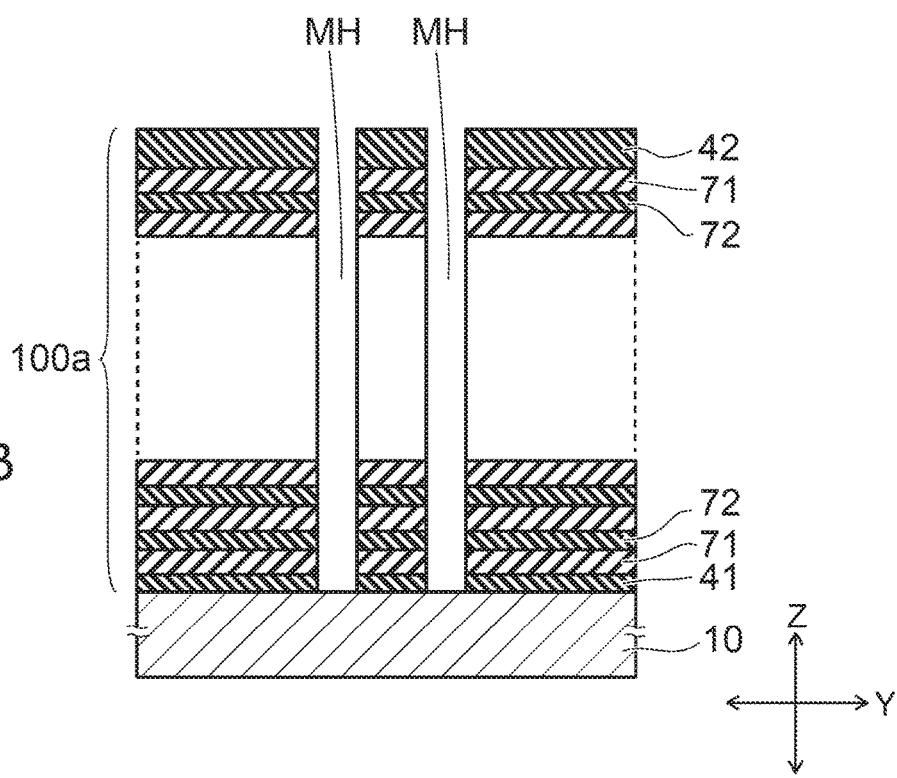

Next, as shown in FIG. 6B, a plurality of memory holes MH are formed in the first stacked part 100a. The memory holes MH are formed by RIE technique using a mask, not shown. The memory hole MH penetrates through the first stacked part 100a to the substrate 10.

As shown in FIG. 7A, a memory film 30 is formed on the side surface and bottom of the memory hole MH. The memory film 30 formed at the bottom of the memory hole MH is removed as shown in FIG. 7B by e.g. RIE technique using a mask, not shown.

Figure 8A:
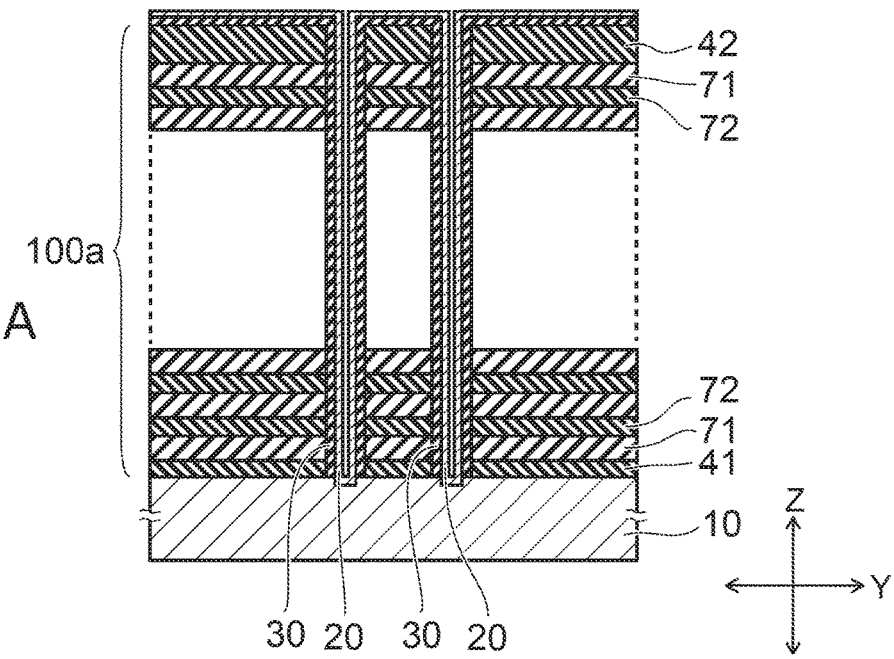

Next, as shown in FIG. 8A, a first semiconductor body 20 is formed inside the memory film 30. The first semiconductor body 20 is formed on the side surface of the memory film 30 and at the bottom of the memory hole MH where the substrate 10 is exposed. The first semiconductor body 20 is formed as e.g. an amorphous silicon film, and then crystallized into a polycrystalline silicon film by heat treatment.

Figure 8B:
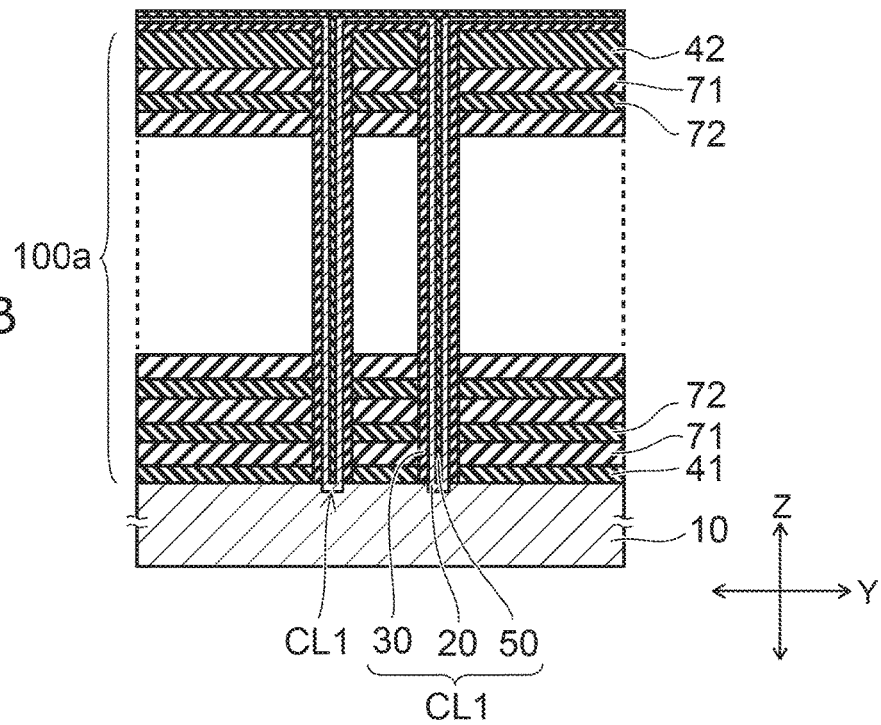

As shown in FIG. 8B, a core film 50 is formed inside the first semiconductor body 20. Thus, a first columnar part CL1 is formed.

Figure 9A:
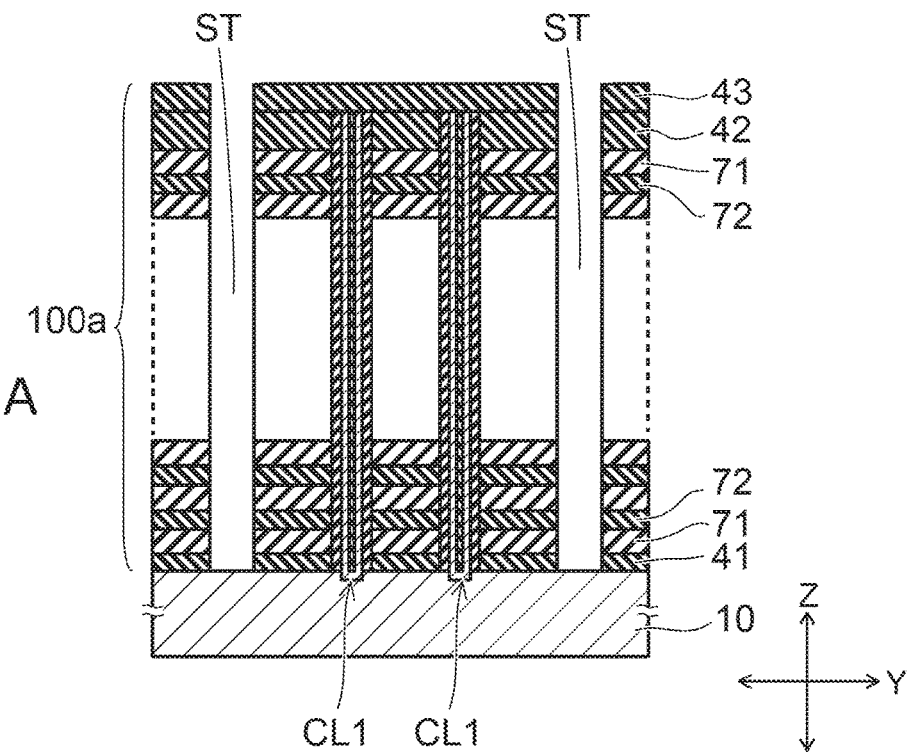

The films deposited on the insulating film 42 shown in FIG. 8B are removed by chemical mechanical polishing (CMP) or etch-back. Then, as shown in FIG. 9A, an insulating film 43 is formed on the insulating film 42. The insulating film 43 covers the upper end of the first columnar part CL1.

Then, by RIE technique using a mask, not shown, a plurality of slits ST are formed in the first stacked part 100a including the insulating film 43, the insulating film 42, the first layers 71, the second layers 72, and the insulating film 41. The slit ST penetrates through the first stacked part 100a to the substrate 10.

Next, the first layer 71 is removed with an etchant or etching gas supplied through the slit ST. For instance, the first layer 71 being a silicon nitride layer is removed with an etchant containing phosphoric acid.

Figure 9B:
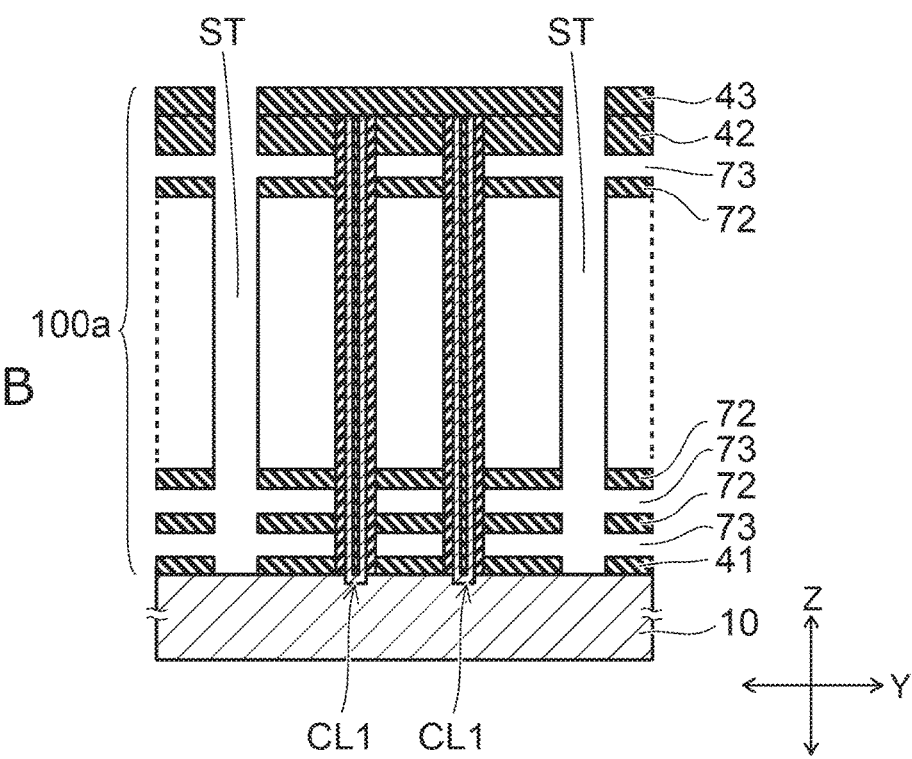

As shown in FIG. 9B, an air gap 73 is formed between the vertically adjacent second layers 72 by the removal of the first layer 71. The air gap 73 is formed also between the insulating film 41 and the lowermost second layer 72, and between the uppermost second layer 72 and the insulating film 42.

The insulating film 43, the insulating film 42, the second layers 72, the insulating film 41, and the substrate 10 have high etching resistance to phosphoric acid, and remain without being removed.

The plurality of second layers 72 stacked with the air gap 73 are supported by the first columnar part CL1. The lower end of the first columnar part CL1 is supported by the substrate 10. The upper end of the first columnar part CL1 is supported by the insulating film 42 and the insulating film 43.

Figure 10A:
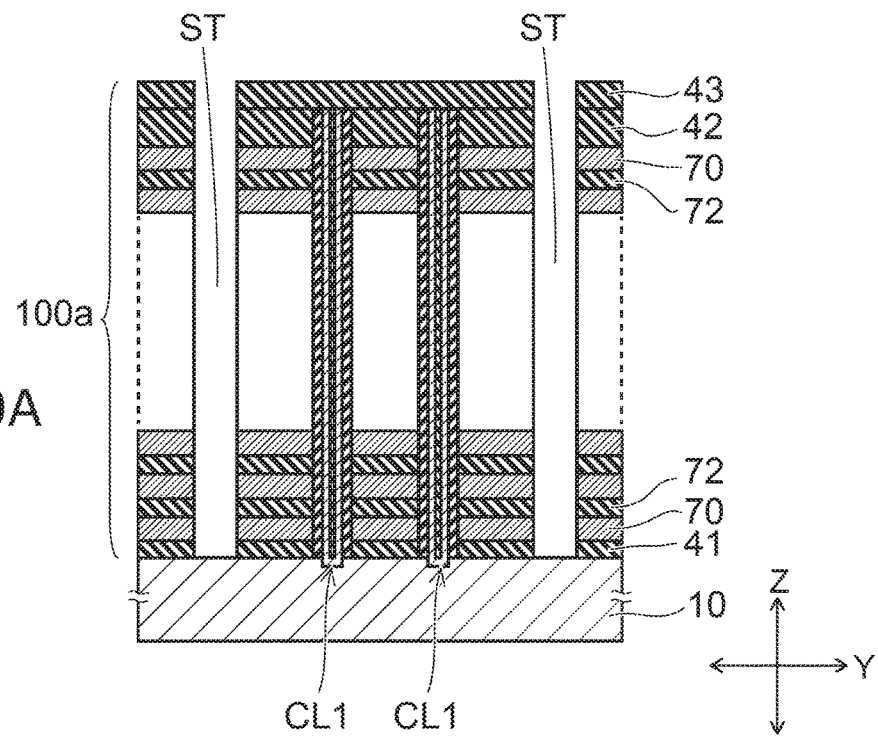

After the first layer 71 is removed, an electrode layer 70 shown in FIG. 10A is formed in the air gap 73. For instance, the electrode layer 70 is formed by chemical vapor deposition (CVD) technique. A source gas is supplied to the air gap 73 through the slit ST. Thus, the electrode layer 70 is formed in the air gap 73. The electrode layer 70 is a metal layer such as a tungsten layer or molybdenum layer.

Figure 10B:
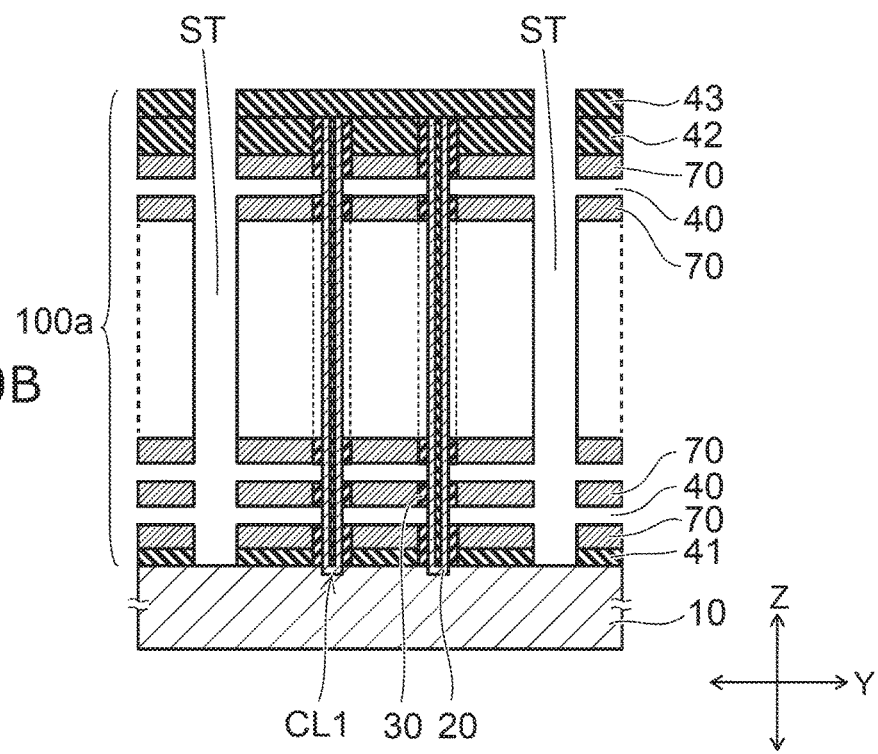

Next, the second layer 72 is removed with an etchant or etching gas supplied through the slit ST. For instance, the second layer 72 being a silicon oxide layer is removed with an etchant containing hydrofluoric acid. As shown in FIG. 10B, an air gap 40 is formed between the vertically adjacent electrode layers 70 by the removal of the second layer 72.

The insulating film 43, the insulating film 42, the electrode layers 70, the insulating film 41, and the substrate 10 have high etching resistance to hydrofluoric acid, and remain without being removed.

Then, the memory film 30 exposed to the air gap 40 is removed. The memory film 30 is removed with an etchant or etching gas supplied through the slit ST and the air gap 40.

The block insulating film 33 and the charge storage film 32 are sequentially etched. The tunnel insulating film 31 may be left. At least the block insulating film 33 and the charge storage film 32 are divided in the stacking direction (Z-direction). At the time of this etching of the memory film 30, the upper end of the first columnar part CL1 is covered with the insulating film 43. Thus, etching of the first columnar part CL1 does not proceed from the upper end side.

The plurality of electrode layers 70 stacked with the air gap 40 are supported by the first columnar part CL1. The protective film 56 shown in FIG. 4A may be formed on the inner wall surface of the air gap 40.

Figure 11A:
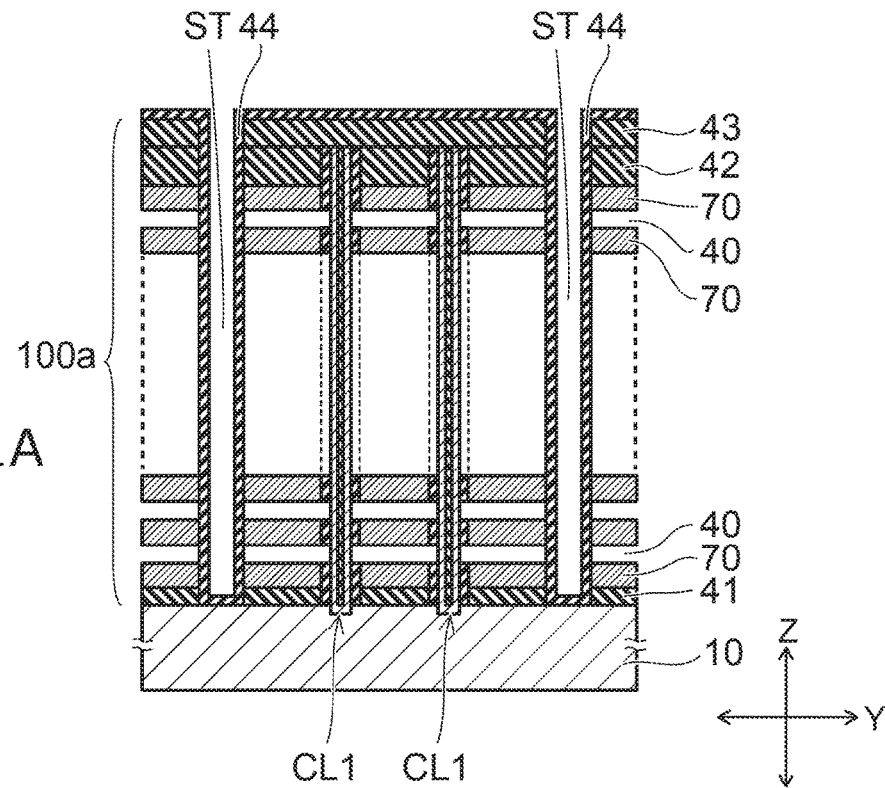

Then, as shown in FIG. 11A, an insulating film 44 is formed on the side surface and bottom of the slit ST. The insulating film 44 has low coverage. Thus, depending on the Z-direction height of the air gap 40, the film thickness of the insulating film 44, and other film formation conditions, the insulating film 44 can be configured to occlude the opening on the slit ST side of the air gap 40 while the air gap 40 is not filled with the insulating film 44.

Alternatively, as shown in FIG. 25A, an insulating film 49 may be formed on the insulating film 43 so as to occlude the upper end of the slit ST without forming an insulating film in the slit ST. An air gap communicating with the air gap 40 between the electrode layers 70 is left in the slit ST.

Figure 11B:
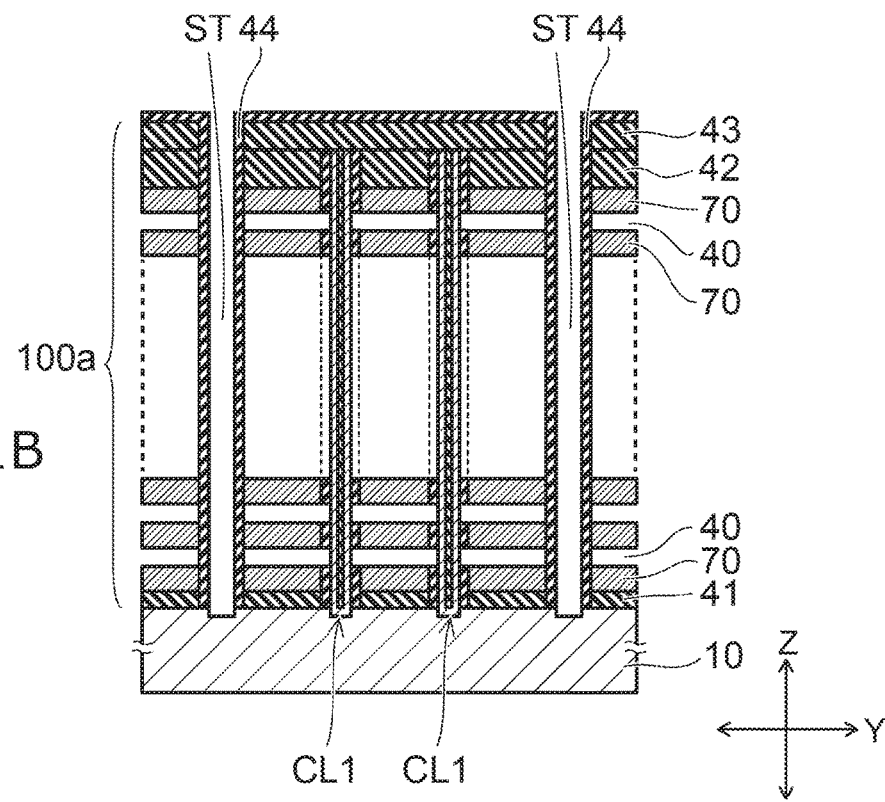

The insulating film 44 formed at the bottom of the slit ST is removed by RIE technique as shown in FIG. 11B. Then, an interconnect part LI is buried in the slit ST as shown in FIG. 3. Then, the bit line BL, the source line SL and the like shown in FIG. 2 are formed.

Next, a method for forming a contact structure in the staircase section 2 is described with reference to FIGS. 12A to 17B.

When the first stacked part 100a shown in FIG. 6A is formed on the substrate 10 in the memory cell array region, a second stacked part 100b is formed also on the substrate 10 in the region in which the staircase section 2 is to be formed. The second stacked part 100b includes the same insulating film 41, first layers 71, second layers 72, and insulating film 42 as those of the first stacked part 100a.

Figure 12A:
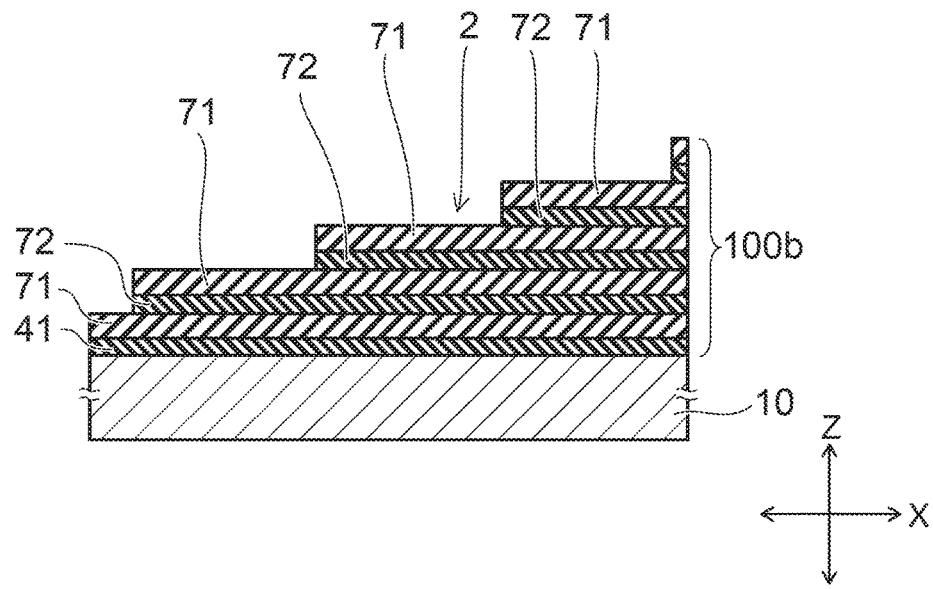

In the second stacked part 100b, the staircase section 2 is formed as shown in FIG. 12A. For instance, anisotropic etching of the first layers 71 and the second layers 72 using a resist film as a mask, reduction of the planar size of the resist film, and anisotropic etching of the first layers 71 and the second layers 72 using the reduced resist film as a mask are repeated. Thus, the first layers 71 and the second layers 72 are processed into a staircase shape arranged in the X-direction.

Figure 12B:
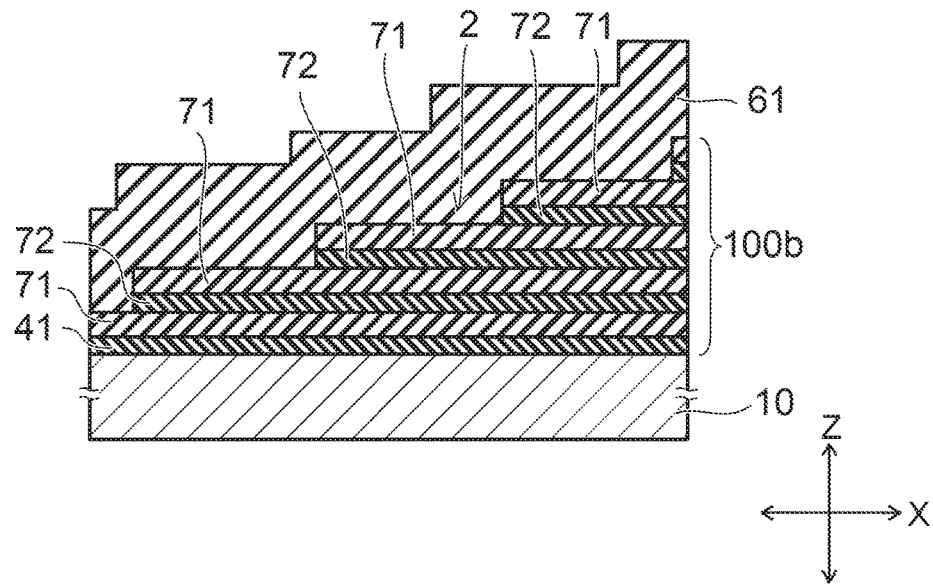

As shown in FIG. 12B, a first cover layer 61 is formed on the staircase section 2. The first cover layer 61 is formed along the staircase shape of the staircase section 2 and covers the surface of the staircase section 2.

Figure 13A:
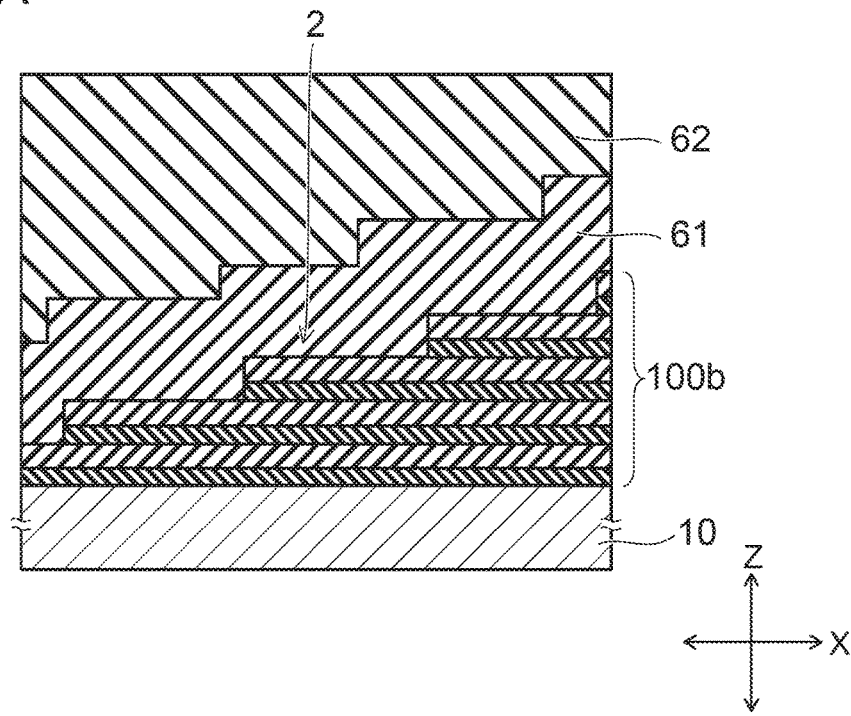

As shown in FIG. 13A, a second cover layer 62 is formed on the first cover layer 61. When the staircase section 2 is formed in the second stacked part 100b, a step difference is formed between the first stacked part 100a and the second stacked part 100b. The first cover layer 61 and the second cover layer 62 are formed so as to reduce or eliminate the step difference. The upper surface of the second cover layer 62 is planarized. This improves the ease and accuracy of lithography and RIE in simultaneously performing the process of forming the first columnar part CL1 in the memory cell array 1 and the process of forming the second columnar part CL2 in the staircase section 2.

The second cover layer 62 is a sacrificial layer to be removed later. At the time of etching for removing the second cover layer 62, the first cover layer 61 covers and protects the staircase section 2. The first cover layer 61 is an insulating layer to be left without being removed. The first cover layer 61 is e.g. a layer of silicon oxide-based material. The second cover layer 62 is also e.g. a layer of silicon oxide-based material. However, the second cover layer 62 has etching selectivity with respect to the first cover layer 61.

The first cover layer 61 and the second cover layer 62 are likewise made of silicon oxide-based material. However, the contained elements and their composition ratio can be made different between the first cover layer 61 and the second cover layer 62 by the difference in e.g. the film formation method such as coating technique and CVD technique. Thus, the etching rate for e.g. the etchant containing hydrofluoric acid can be made different between the first cover layer 61 and the second cover layer 62 to provide etching selectivity.

Figure 13B:
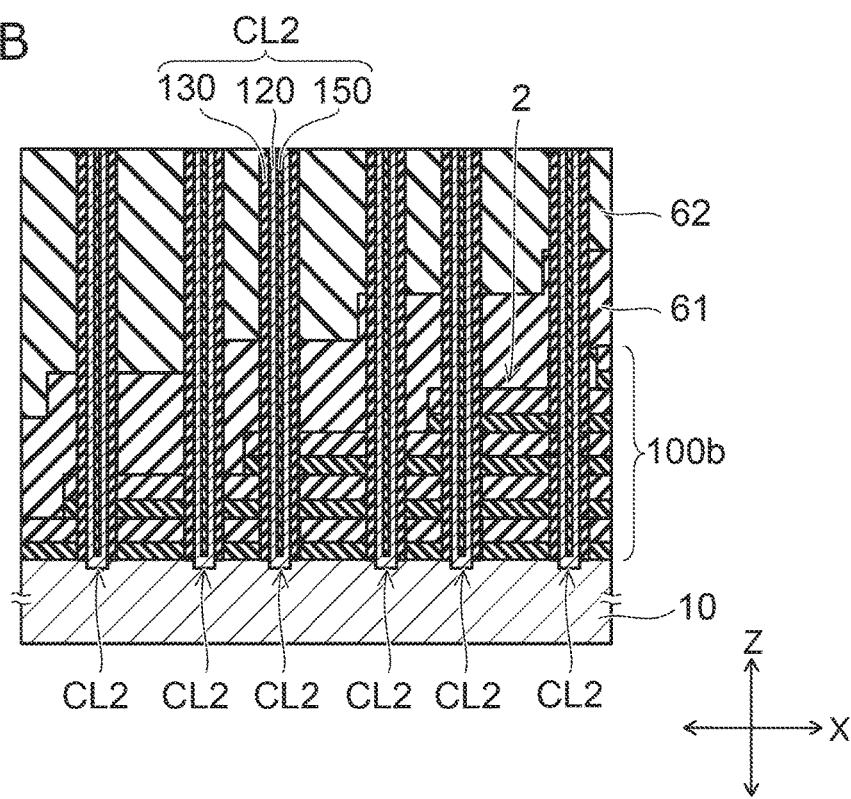

As shown in FIG. 13B, a plurality of second columnar parts CL2 are formed in the second stacked part 100b, the first cover layer 61, and the second cover layer 62. The second columnar part CL2 penetrates through the second cover layer 62, the first cover layer 61, and the second stacked part 100b to the substrate 10. The second columnar parts CL2 are formed at the same time as the first columnar parts CL1 of the memory cell array 1 are formed.

That is, when the memory holes MH shown in FIG. 6B are formed, a plurality of holes having the same depth as the memory holes MH are formed also in the second cover layer 62, the first cover layer 61, and the second stacked part 100b. When the memory film 30 of the first columnar part CL1 is formed, the insulating film 130 of the second columnar part CL2 is formed from the same material. When the first semiconductor body 20 of the first columnar part CL1 is formed, the second semiconductor body 120 of the second columnar part CL2 is formed from the same material. When the core film 50 of the first columnar part CL1 is formed, the core film 150 of the second columnar part CL2 is formed from the same material. At this time, the length (Z-direction length) of the first columnar part CL1 and the second columnar part CL2 is equal.

Figure 14A:
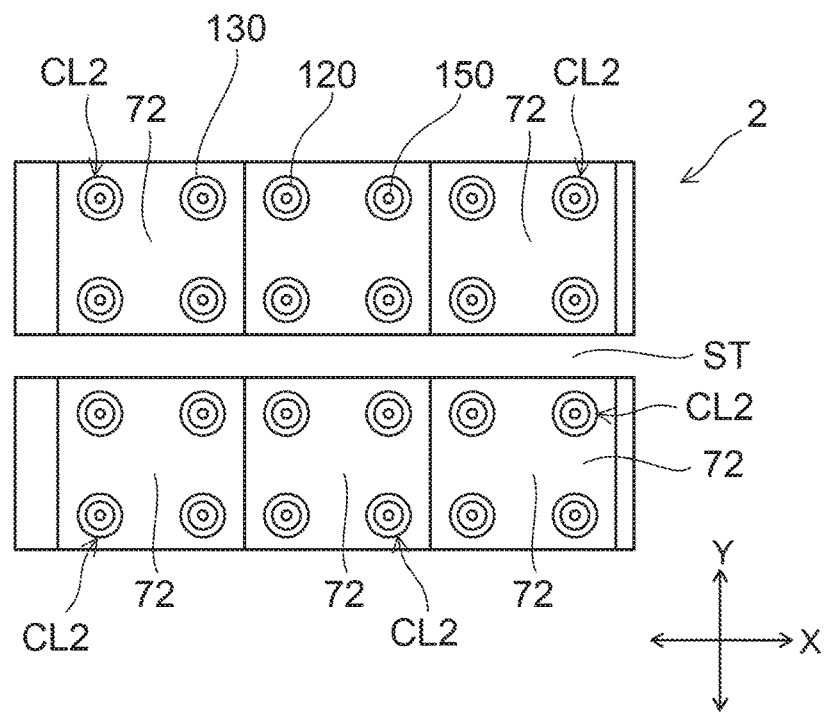
FIG. 14A is a schematic plan view showing a method for manufacturing the semiconductor device of the embodiment.

When the slit ST shown in FIG. 9A is formed in the first stacked part 100a, the slit ST is formed also in the second cover layer 62, the first cover layer 61, and the second stacked part 100b as shown in FIG. 14A. The second cover layer 62, the first cover layer 61, and the second stacked part 100b are divided by the slit ST into a plurality of blocks in the Y-direction.

Figure 14B:
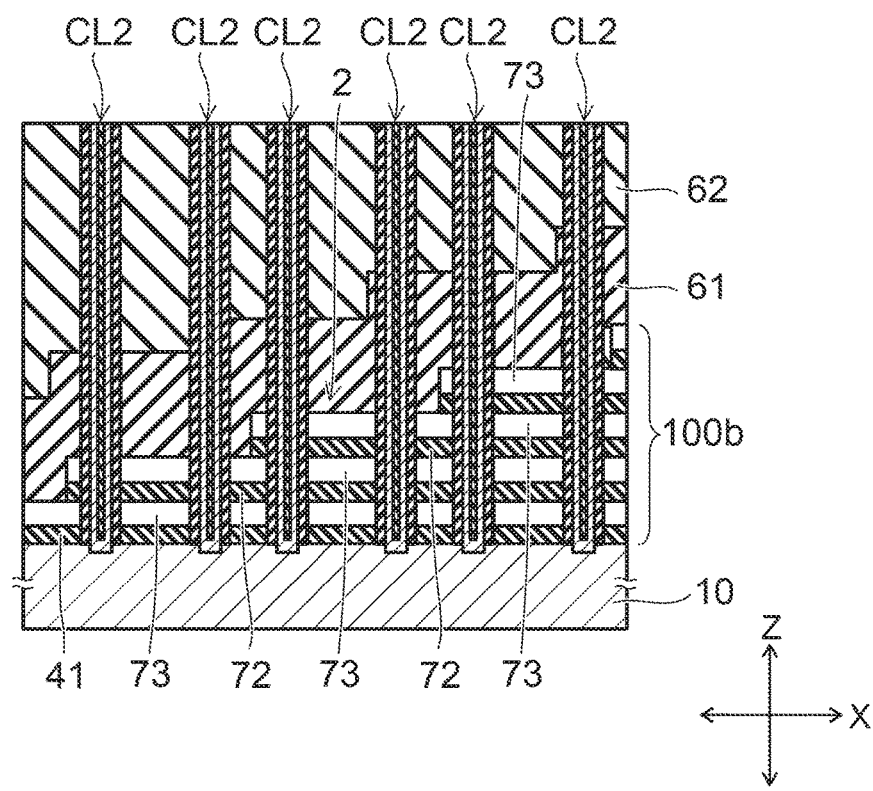

Next, when the first layer 71 of the first stacked part 100a is removed by etching through the slit ST to form the air gap 73 as shown in FIG. 9B, the first layer 71 of the second stacked part 100b is also removed by etching through the slit ST. Thus, as shown in FIG. 14B, the air gap 73 is formed also between the second layers 72 of the second stacked part 100b.

Figure 15A:
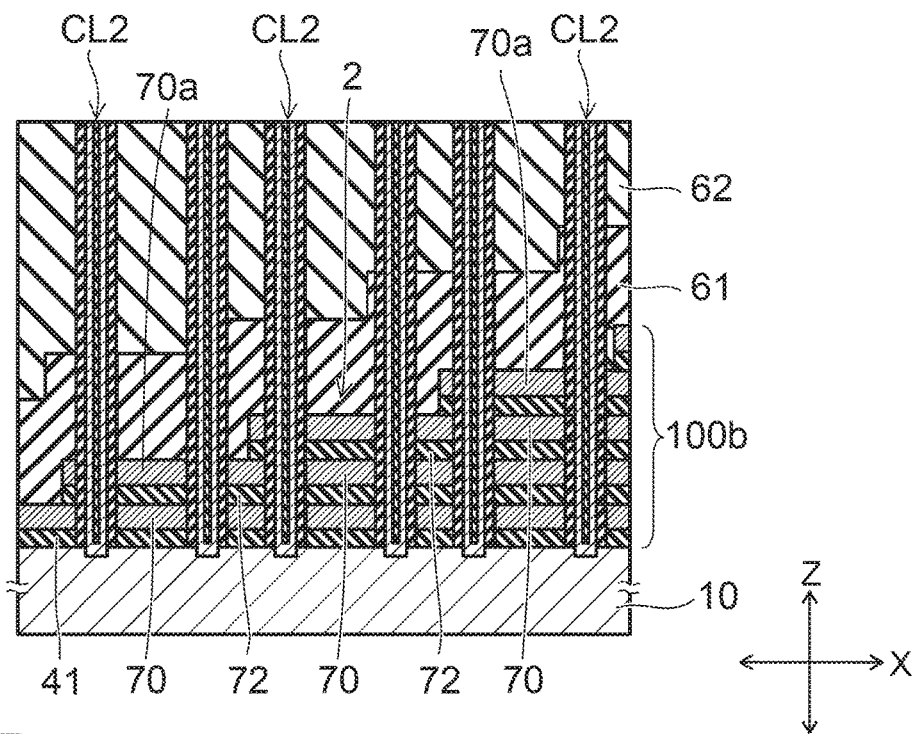

Furthermore, when the electrode layer 70 is formed in the air gap 73 of the first stacked part 100a, the electrode layer 70 is formed also in the air gap 73 of the second stacked part 100b as shown in FIG. 15A. The plurality of electrode layers 70 of the second stacked part 100b have a plurality of end parts (terrace parts) 70a arranged in a staircase shape in the X-direction.

Figure 15B:
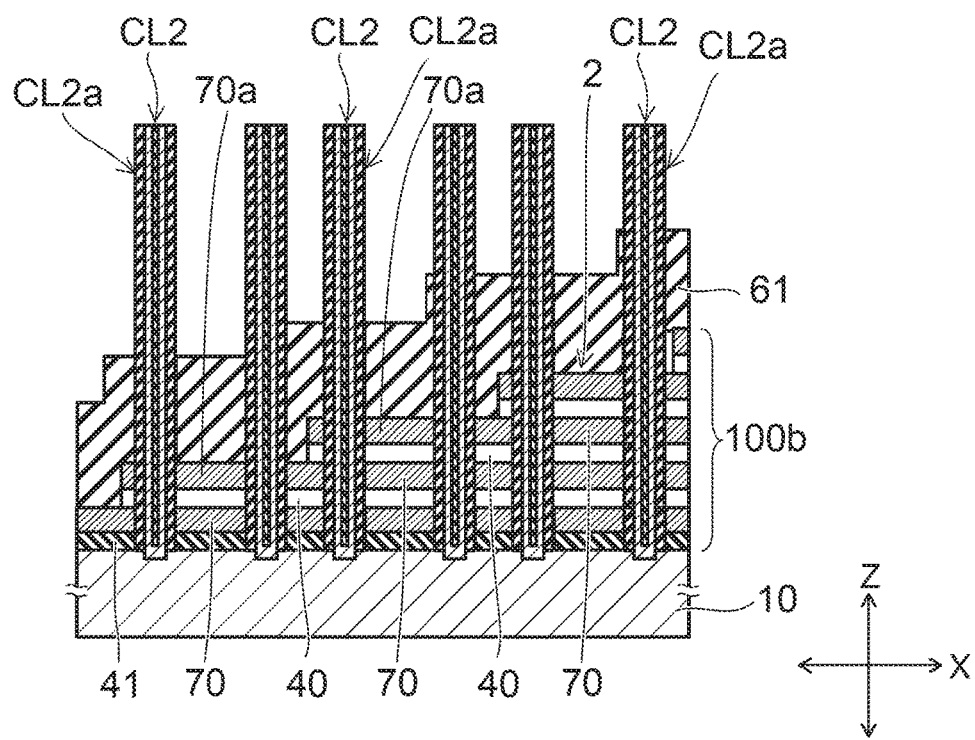

Next, when the second layer 72 between the electrode layers 70 of the first stacked part 100a is removed, the second layer 72 of the second stacked part 100b is also removed by etching through the slit ST. As shown in FIG. 15B, the air gap 40 is formed between the electrode layers 70 of the second stacked part 100b.

The second layer 72 is a silicon oxide layer. The second layer 72 is removed with e.g. an etchant containing hydrofluoric acid. At this time, the second cover layer 62 of the silicon oxide-based material is also removed with the etchant containing hydrofluoric acid as shown in FIG. 15B. The first cover layer 61 is a layer of the silicon oxide-based material having higher etching resistance to the etchant containing hydrofluoric acid than the second layer 72 and the second cover layer 62. Thus, the first cover layer 61 is left without being removed.

The second layer 72 is removed, and part of the second columnar part CL2 in the length direction (Z-direction) is exposed as shown in FIG. 15B. In the second columnar part CL2, part of the protrusion CL2a protruding above the end part 70a of the electrode layer 70 is exposed. The portion below the exposed part is covered with the first cover layer 61 and the second stacked part 100b. The lower part of the protrusion CL2a of the second columnar part CL2 on the near side of the end part 70a of the electrode layer 70 is covered with the first cover layer 61. The portion above that lower part is exposed.

Figure 16A:
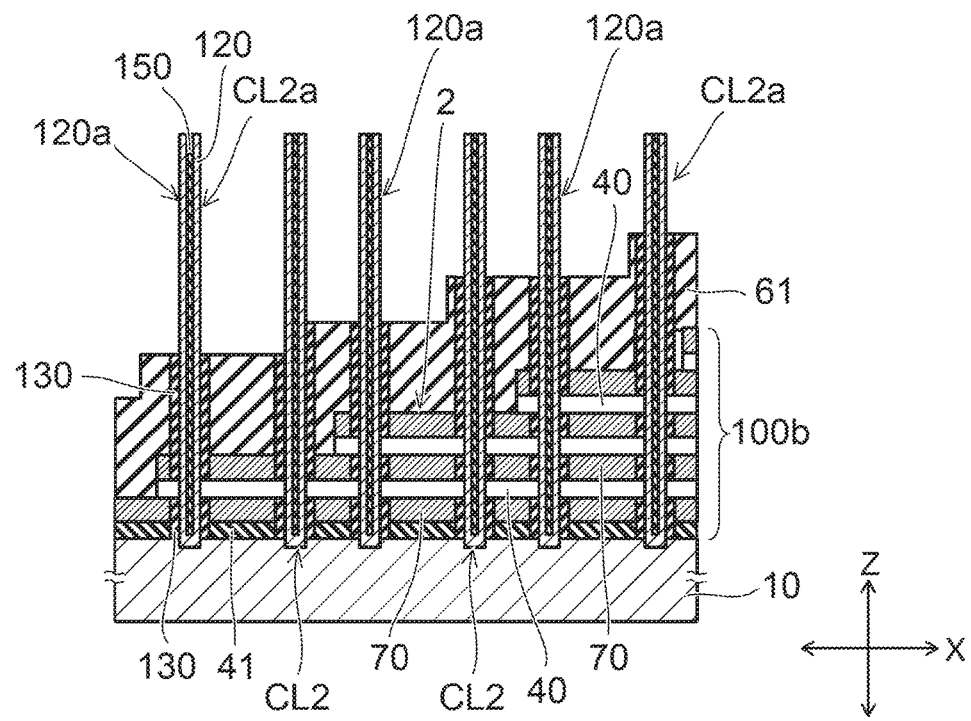

Next, in the step shown in FIG. 10B, the memory film 30 of the first columnar part CL1 exposed to the air gap 40 is removed by etching through the slit ST. In this step, the memory film 30 of the second columnar part CL2 exposed to the air gap 40 is also removed as shown in FIG. 16A. Furthermore, the memory film 30 of the protrusion CL2a exposed above the first cover layer 61 is also removed at this time.

As shown in FIG. 16A, part of the second semiconductor body 120 is exposed by the removal of the memory film 30 of the protrusion CL2a. In the second semiconductor body 120, part of the protrusion 120a protruding above the end part 70a of the electrode layer 70 is exposed. The portion below the exposed part is covered with the first cover layer 61 and the second stacked part 100b. The lower part of the protrusion 120a of the second semiconductor body 120 on the near side of the end part 70a of the electrode layer 70 is covered with the first cover layer 61 via the memory film 30. The portion above that lower part is exposed.

Figure 16B:
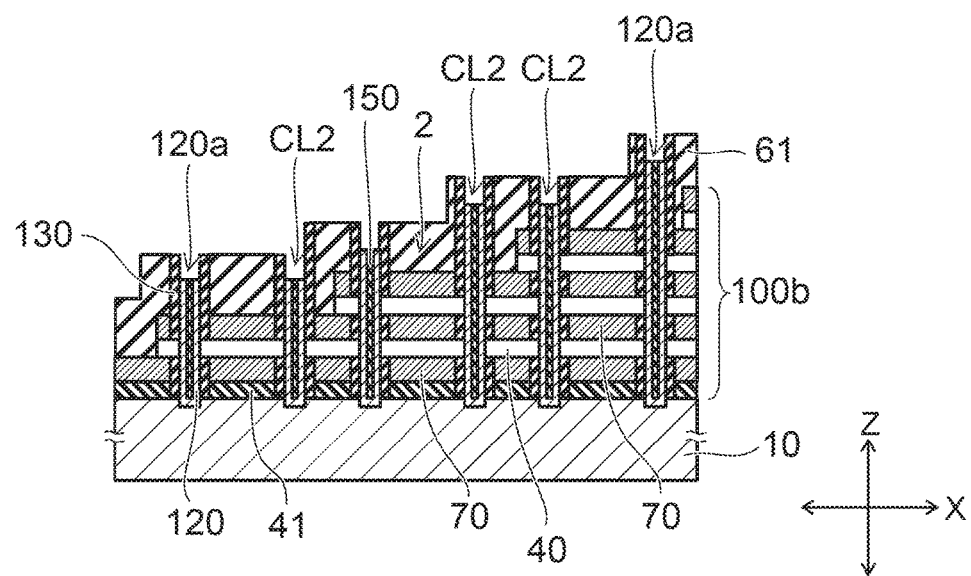

The exposed part of the second semiconductor body 120 being a silicon body is removed with e.g. an alkaline etchant. As shown in FIG. 16B, the length of the second semiconductor body 120 is shortened. The position of the upper end of the second semiconductor body 120 is retracted below the upper surface of the first cover layer 61. The core film 150 protruding above the first cover layer 61 is removed before or after removing the exposed part of the second semiconductor body 120. Alternatively, the core film 150 protruding above the first cover layer 61 may be left.

Figure 17A:
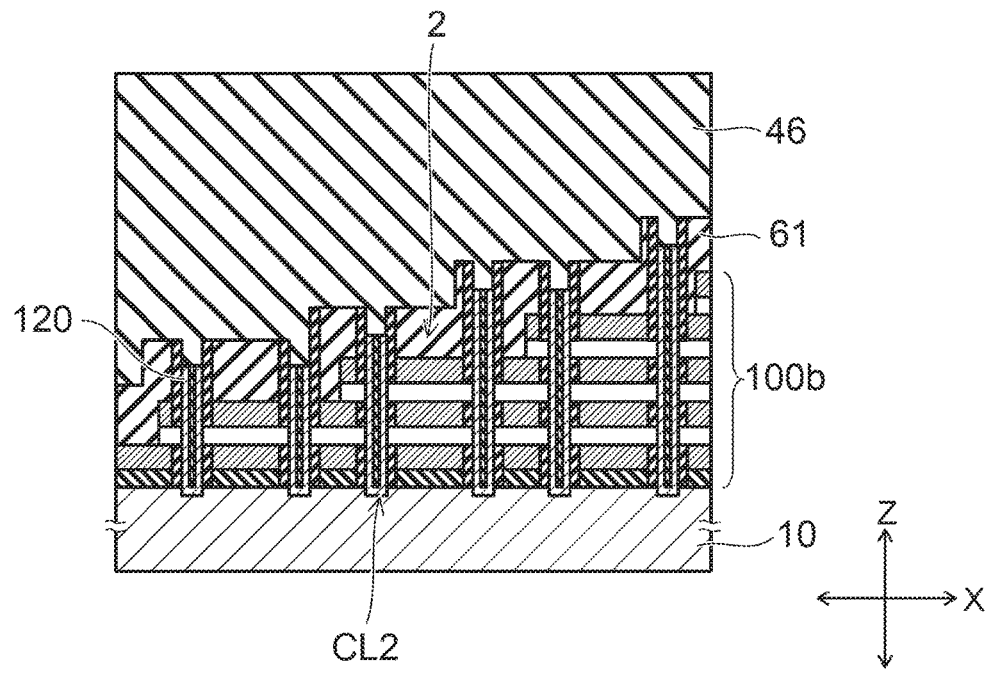

After the length of the second semiconductor body 120 is shortened, an insulating layer 46 is formed on the first cover layer 61 as shown in FIG. 17A.

Figure 17B:
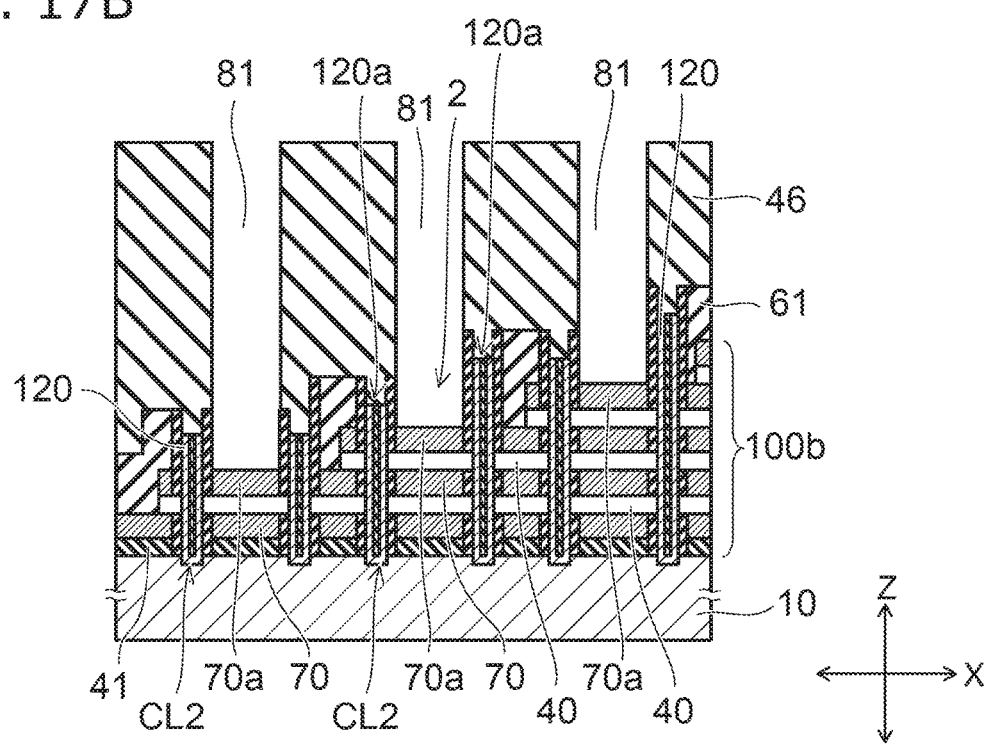

As shown in FIG. 17B, a plurality of contact holes 81 are formed in the insulating layer 46 and the first cover layer 61. The contact holes 81 are formed by RIE technique using a mask, not shown.

The plurality of contact holes 81 penetrate through the insulating layer 46 and the first cover layer 61 to the end parts 70a of the corresponding electrode layers 70.

Then, a metal material is buried in the contact hole 81. Thus, the contact via 91 shown in FIG. 5B is formed.

Next, FIGS. 18A to 21B are schematic sectional views showing an alternative example of the method for forming a contact structure in the staircase section 2.

After the step of FIG. 12A described above, a cover layer 63 is formed on the staircase section 2 as shown in FIG. 18A. Furthermore, a second columnar part CL2 penetrating through the cover layer 63 and the second stacked part 100b to the substrate 10 is formed. The cover layer 63 is e.g. a layer of silicon oxide-based material.

Figure 19A:
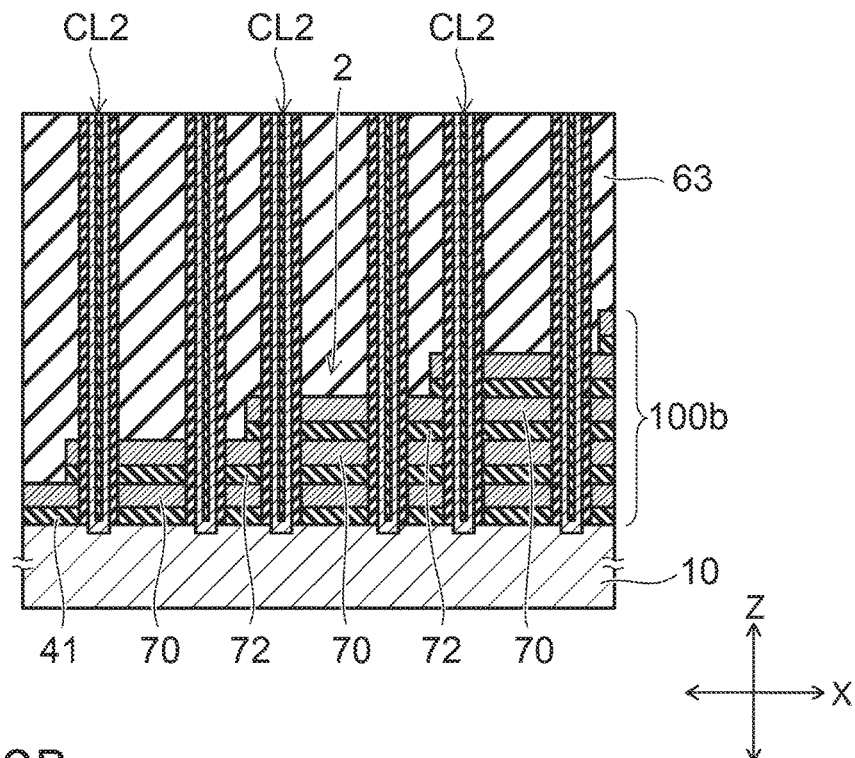

Then, replacement of the first layer 71 by the electrode layer 70 shown in FIGS. 18B and 19A is performed like the aforementioned steps.

Figure 19B:
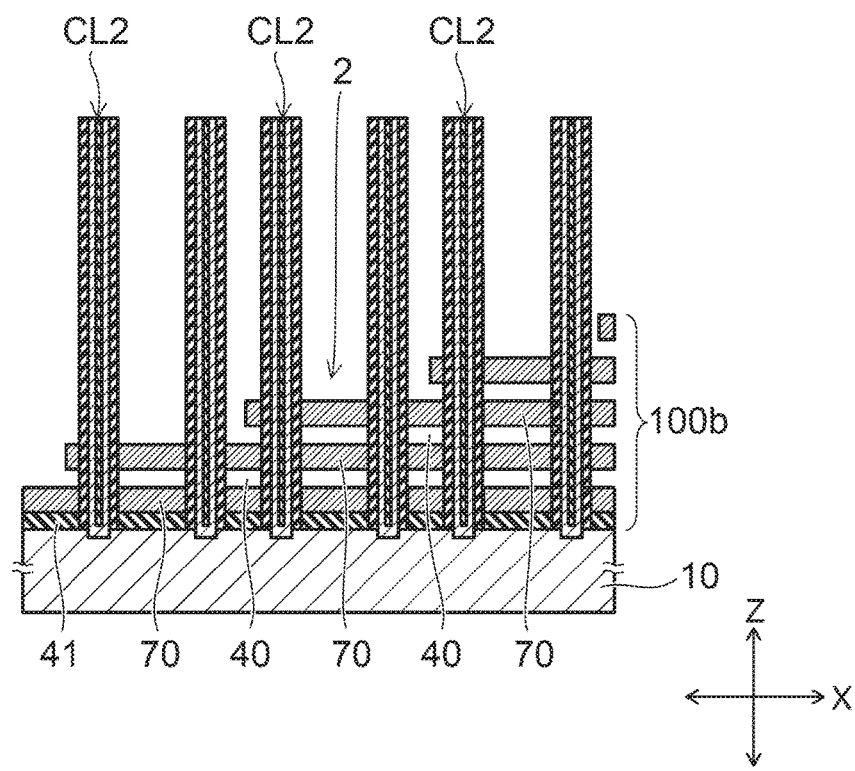

Then, when the second layer 72 is removed to form the air gap 40 between the electrode layers 70, the cover layer 63 of the same silicon oxide-based material as the second layer 72 is also removed. As shown in FIG. 19B, the second columnar part CL2 is exposed in the portion except the portion surrounded circumferentially with the electrode layer 70.

Figure 20A:
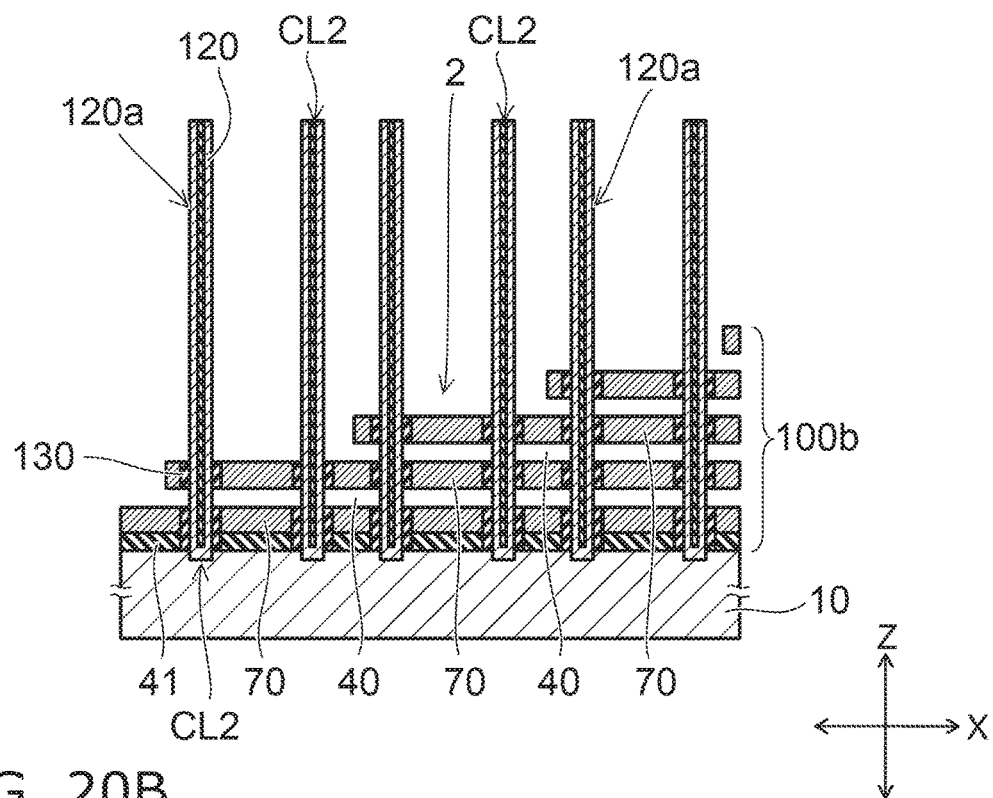

Next, the memory film 30 exposed to the air gap 40 is removed. At this time, the memory film 30 of the second columnar part CL2 protruding above the second stacked part 100b is also removed. As shown in FIG. 20A, in the second semiconductor body 120, the protrusion 120a protruding above the second stacked part 100b is exposed.

Figure 20B:
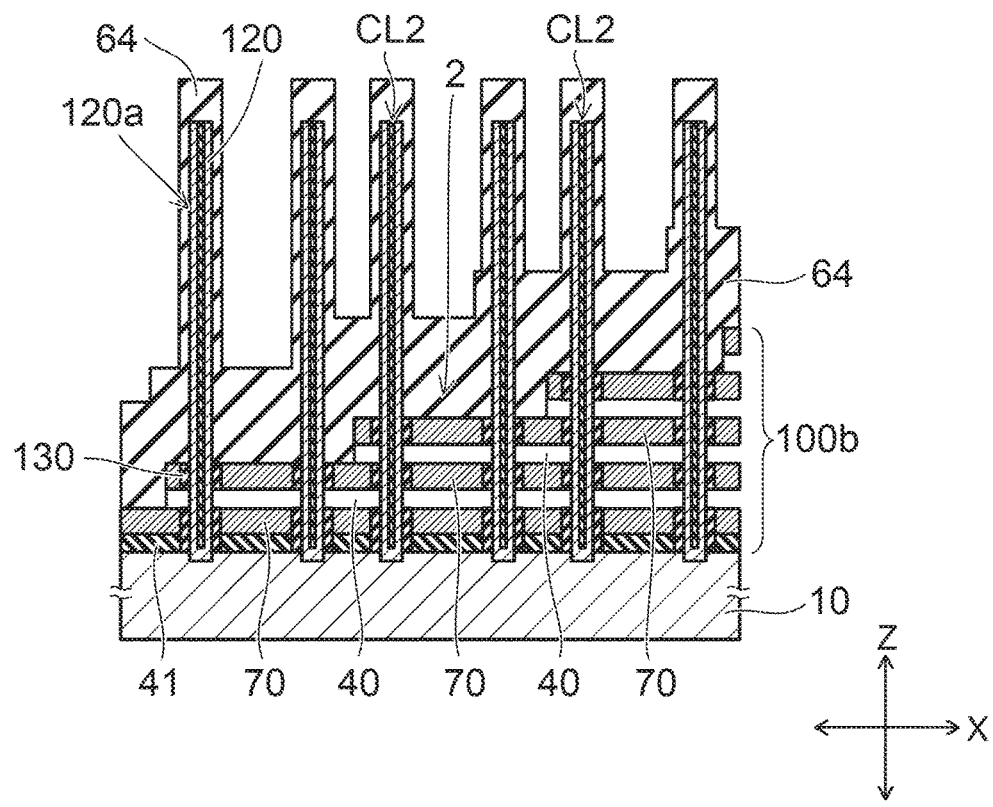

Next, as shown in FIG. 20B, an insulating film 64 is formed on the staircase section 2. The insulating film 64 is e.g. a silicon oxide film. The insulating film 64 is deposited on the staircase section 2, and formed also on the side surface and the upper surface of the protrusion 120a of the second semiconductor body 120. The insulating film 64 is formed by e.g. plasma CVD technique in which the deposition is thicker in the Z-direction than on the side surface of the protrusion 120a of the second semiconductor body 120.

Figure 21A:
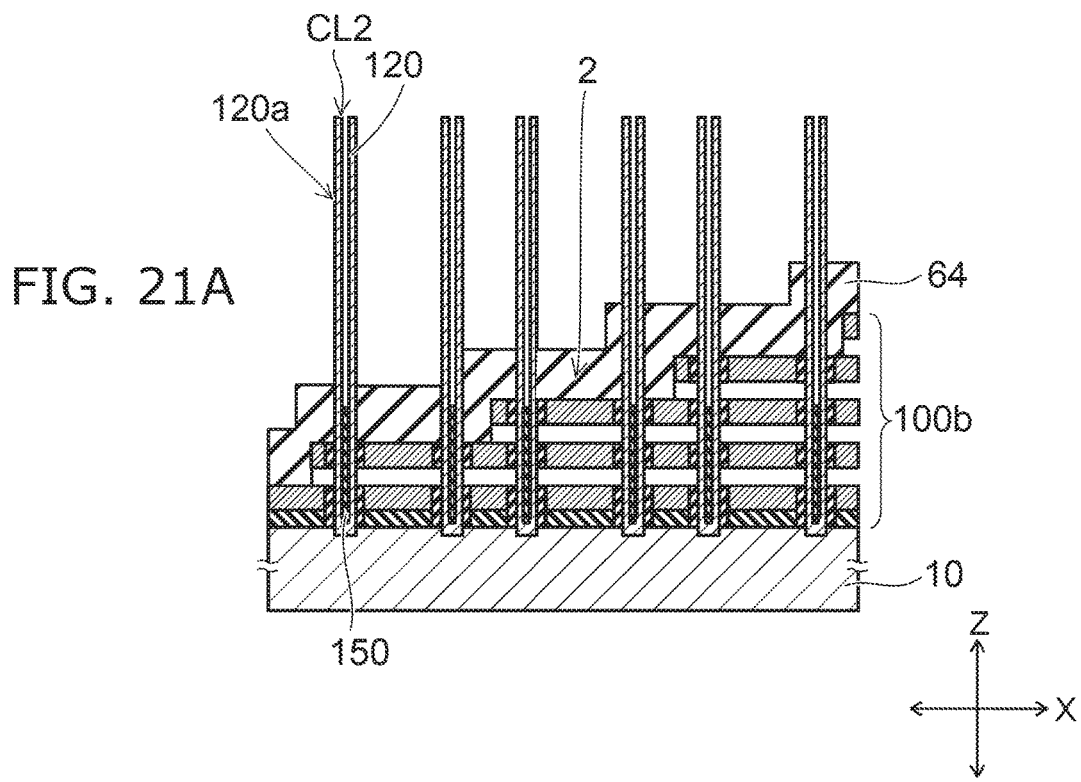

Next, the insulating film 64 formed thinly on the side surface of the protrusion 120a of the second semiconductor body 120 and the insulating film 64 deposited on the upper surface of the protrusion 120a are removed with an etchant or etching gas. As shown in FIG. 21A, part of the protrusion 120a of the second semiconductor body 120 is exposed.

The insulating film 64 deposited on the staircase section 2 is also retracted downward. However, the insulating film 64 deposited on the staircase section 2 is thicker in film thickness than the insulating film 64 formed on the side surface of the protrusion 120a. Thus, the insulating film 64 deposited on the staircase section 2 remains in the state of covering the second stacked part 100b.

The core film 150 inside the protrusion 120a of the second semiconductor body 120 is removed during or after the aforementioned etching of the insulating film 64.

Figure 21B:
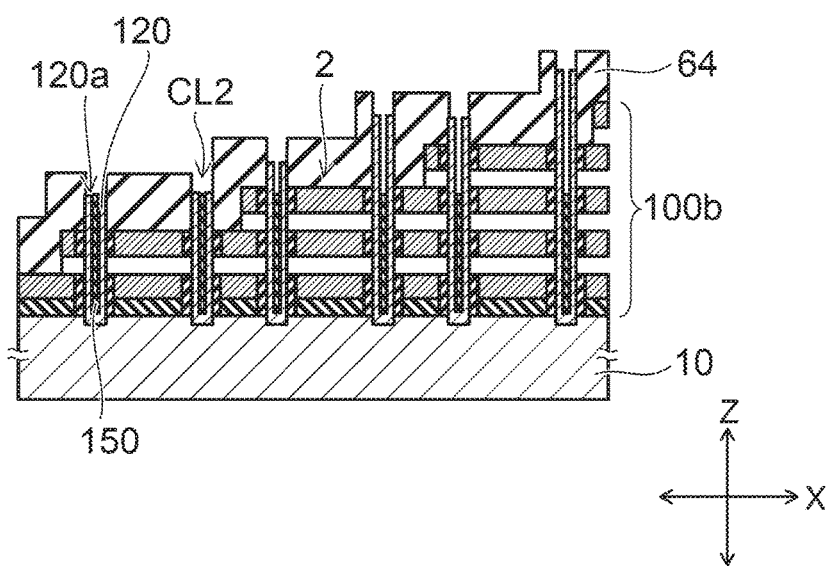

The exposed part of the second semiconductor body 120 being a silicon body is removed with e.g. an alkaline etchant. As shown in FIG. 21B, the length of the second semiconductor body 120 is shortened. The position of the upper end of the second semiconductor body 120 is retracted below the upper surface of the insulating film 64. In FIG. 20B, the core film 150 protruding above the insulating film 64 deposited on the staircase section 2 may be removed after this etching of the second semiconductor body 120. Alternatively, that core film 150 may be left.

Then, the steps as in FIGS. 17A and 17B are continued.

Next, FIGS. 22A to 23B are schematic sectional views showing a further alternative example of the method for forming a contact structure in the staircase section 2.

Figure 22A:
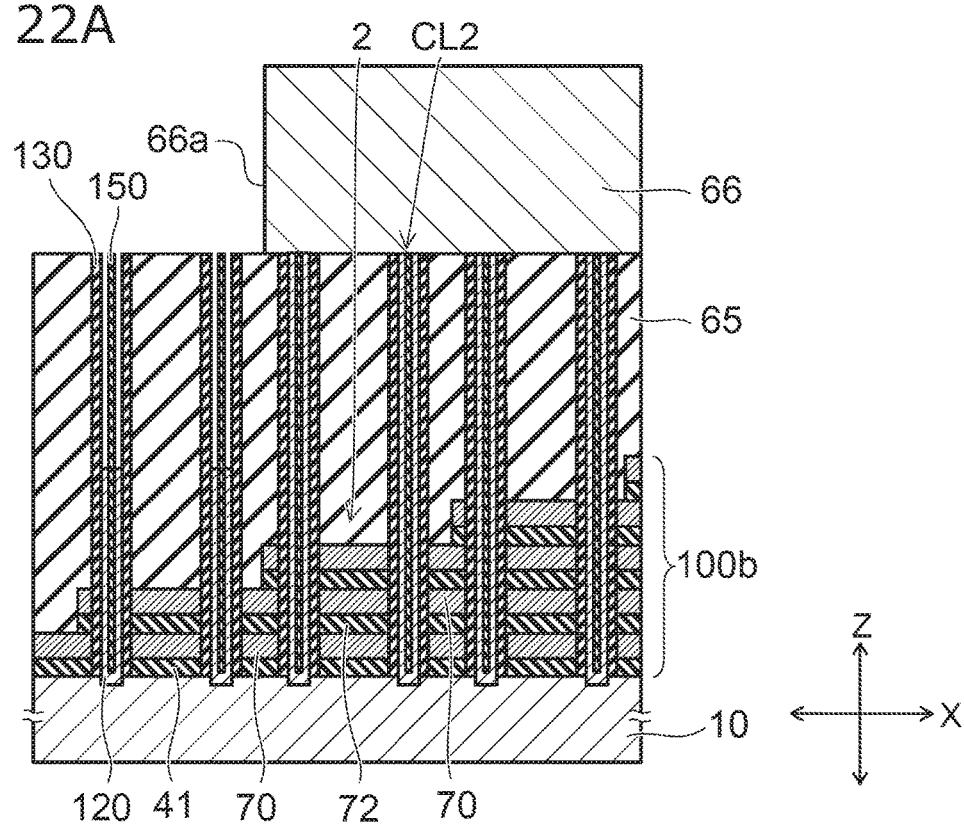
Figure 22B:
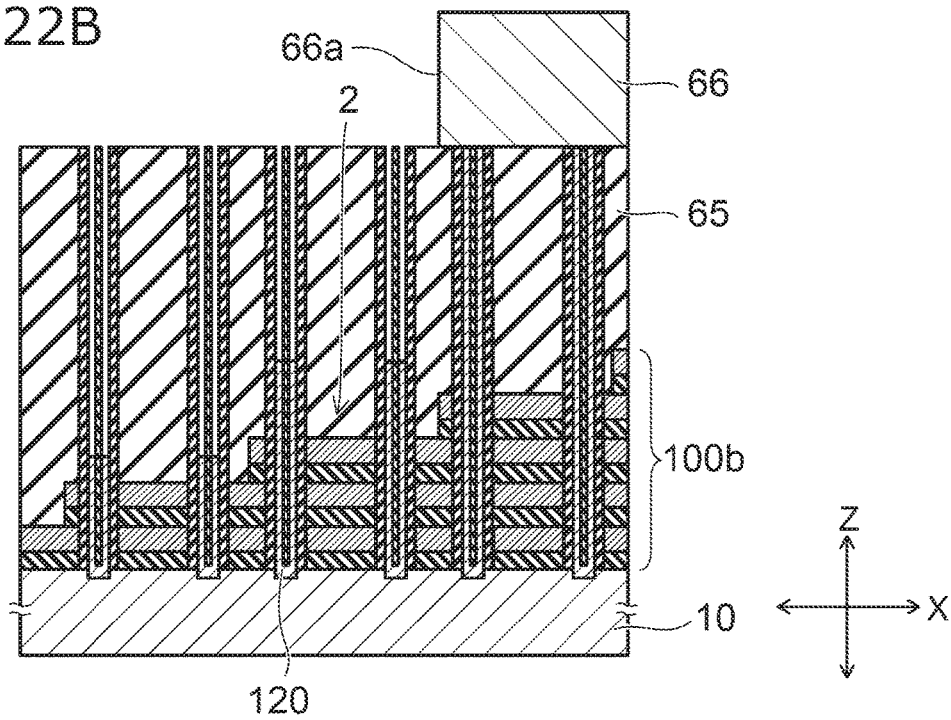

After the step of FIG. 12A described above, an insulating layer 65 doubling as a cover layer shown in FIG. 22A is formed on the staircase section 2. Furthermore, the second columnar part CL2 penetrating through the insulating layer 65 and the second stacked part 100b to the substrate 10 is formed. The insulating layer 65 is e.g. a layer of silicon oxide-based material. At this time, the first layer 71 has not yet been replaced by an electrode layer 70. Then, replacement of the first layer 71 by the electrode layer 70 is performed like the aforementioned steps.

Then, as shown in FIG. 22A, a resist film 66 is formed on the insulating layer 65 and patterned. Some of the plurality of second columnar parts CL2 formed on the lower stage side are not covered with the resist film 66. The second columnar parts CL2 on the upper stage side above the second columnar parts CL2 on the lower stage side are covered with the resist film 66. In the second columnar parts CL2 not covered with the resist film 66, the upper end of the second semiconductor body 120 is exposed from the resist film 66.

Then, the second semiconductor body 120 of the second columnar part CL2 not covered with the resist film 66 is etched by e.g. RIE technique. The upper end of the second semiconductor body 120 is retracted downward.

Then, a process for reducing the planar size of the resist film 66 (slimming process) is performed. The edge 66a of the resist film 66 is retracted in the X-direction from the lower stage side to the upper stage side of the staircase section 2. The upper end of the second semiconductor body 120 formed in the region adjacent on the upper stage side of the stage in which the second semiconductor body 120 is etched in the previous step is exposed from the slimmed resist film 66.

Then, the second semiconductor body 120 not covered with the resist film 66 is etched by RIE technique. Thus, the upper end of the second semiconductor body 120 is retracted downward. The upper end of the semiconductor body 120 on the lower stage side etched in the previous step is further retracted downward.

Subsequently, the slimming process of the resist film 66 and the etching of the second semiconductor body 120 are repeated. By this repetition, as shown in FIG. 23A, the upper end of the second semiconductor body 120 on the lower stage side may be retracted below the electrode layer 70. Alternatively, the second semiconductor body 120 may be eliminated.

In this example, the second layer 72 is left intact as an insulating layer without forming an air gap between the electrode layers 70, including the memory cell array shown in FIG. 25B. Thus, the second columnar part CL2 including the second semiconductor body 120 only needs to function as a support for the second stacked part 100b including an air gap produced in the process of replacing the first layer 71 by an electrode layer 70. Subsequently, the second semiconductor body 120 may be eliminated.

The core film 150 in the portion in which the second semiconductor body 120 is etched may be left or removed. The second semiconductor body 120 is etched, and a void is formed inside the memory film 30. As shown in FIG. 23B, an insulating film 67 is buried in the void.

In the step of forming the first stacked part 100a shown in FIG. 6A, an electrode layer may be formed as the first layer 71, and a sacrificial layer may be formed as the second layer 72. Then, the electrode layer may be left intact, and the sacrificial layer may be removed to form an air gap between the electrode layers. The second layer 72 as a sacrificial layer may be replaced by an insulating layer. This also applies to the second stacked part 100b. In this case, for instance, the electrode layer is a metal layer. The sacrificial layer is a silicon oxide layer, or a metal layer different from the electrode layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a substrate;
   a stacked body provided above the substrate, the stacked body including a plurality of electrode layers stacked with an insulator, the electrode layers having a plurality of end parts formed in a staircase shape, the stacked body including a first stacked part and a second stacked part including the end parts;
   a first columnar part including a first semiconductor body extending in a stacking direction in the first stacked part, and a stacked film provided between the first semiconductor body and one of the electrode layers, the stacked film including a charge storage part;
   an insulating layer provided above the second stacked part;
   a plurality of contact vias extending in the stacking direction in the insulating layer, and being in contact with the end parts of the electrode layers; and
   a plurality of second columnar parts extending in the stacking direction in the second stacked part, and including a plurality of second semiconductor bodies being different in length in the stacking direction.

2. The device according to claim 1, wherein lengths in the stacking direction of the second semiconductor bodies is shorter than a length in the stacking direction of the first semiconductor body.

3. The device according to claim 1, wherein the second semiconductor bodies include a second semiconductor body having a protrusion protruding above the second stacked part.

4. The device according to claim 3, wherein a length of the protrusion is shorter than a length of a portion of the second semiconductor body, the portion extending in the second stacked part.

5. The device according to claim 1, wherein
   the second stacked part includes a lower stage part, and an upper stage part having a larger number of stacked layers of the electrode layers than the lower stage part,
   the second semiconductor bodies include
   an upper-stage second semiconductor body provided in the upper stage part, and
   a lower-stage second semiconductor body provided in the lower stage part, a length in the stacking direction of the lower-stage second semiconductor body being shorter than a length in the stacking direction of the upper-stage second semiconductor body.

6. The device according to claim 1, wherein the second semiconductor bodies include a second semiconductor body having an upper end located in the second stacked part, the upper end not protruding from the second stacked part.

7. The device according to claim 1, wherein
   the contact vias include a contact via having an upper part located above upper ends of the second semiconductor bodies, and
   a side surface of the upper part of the contact via overlaps a region in which a second semiconductor body provided adjacent to the contact via is extended upward.

8. The device according to claim 1, wherein
   the second columnar parts further includes insulating films provided between the electrode layers of the second stacked part and the second semiconductor bodies, and
   the insulating films include a film of same material as the stacked film of the first columnar part.

9. The device according to claim 1, wherein the insulator between the electrode layers is a first air gap.

10. The device according to claim 9, wherein the charge storage part is divided in the stacking direction by a second air gap formed continuous to the first air gap.

11. The device according to claim 1, further comprising:
    a separation part extending in a first direction parallel to a major surface of the substrate, and dividing the first stacked part and the second stacked part into a plurality of blocks in a second direction intersecting the first direction in a plane parallel to the major surface of the substrate.

12. The device according to claim 11, wherein the end parts of the electrode layers are arranged in the staircase shape along the first direction.

13. The device according to claim 11, wherein one of the contact vias and the second semiconductor bodies placed around the contact via are provided per one of the end parts of one of the electrode layers in one of the blocks.

14. The device according to claim 11, wherein
    a lower end of the first semiconductor body is in contact with the substrate, and
    the separation part includes an interconnect part spread in the stacking direction and the first direction, and a lower end of the interconnect part is in contact with the substrate.

15. The device according to claim 1, wherein
    the contact vias include
    a lower-stage contact via in contact with the end part of a lower electrode layer of the electrode layers, and
    an upper-stage contact via in contact with the end part of an upper electrode layer above the lower electrode layer, a length in the stacking direction of the upper-stage contact via being shorter than a length in the stacking direction of the lower-stage contact via, and
    a length in the stacking direction of a second semiconductor body provided adjacent to the lower-stage contact via is shorter than a length in the stacking direction of a second semiconductor body provided adjacent to the upper-stage contact via.

* * * * *